United States Patent
Huang et al.

(10) Patent No.: US 10,462,431 B2
(45) Date of Patent: Oct. 29, 2019

(54) IMAGE SENSORS

(71) Applicant: VisEra Technologies Company Limited, Hsin-Chu (TW)

(72) Inventors: Tzu-Wei Huang, Zhubei (TW); Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 443 days.

(21) Appl. No.: 14/683,792

(22) Filed: Apr. 10, 2015

(65) Prior Publication Data
US 2016/0301897 A1 Oct. 13, 2016

(51) Int. Cl.
*H01L 27/146* (2006.01)
*H04N 9/04* (2006.01)

(52) U.S. Cl.
CPC ....... *H04N 9/045* (2013.01); *H01L 27/14621* (2013.01); *H01L 27/14623* (2013.01); *H01L 27/14627* (2013.01); *H01L 27/1464* (2013.01)

(58) Field of Classification Search
CPC ............ H04N 9/045; H04N 9/33; H04N 5/33; H04N 5/335; H04N 5/32; H01L 27/3269; H01L 27/146; H01L 27/14623; H01L 27/14621; H01L 27/14625; H01L 27/14627; H01L 27/14645; H01L 27/14667; H01L 27/14647; H01L 27/1465; H01L 27/148
See application file for complete search history.

(56) References Cited

U.S. PATENT DOCUMENTS

| | | | |
|---|---|---|---|
| 5,910,880 A * | 6/1999 | DeBoer | H01G 4/10 257/296 |
| 8,139,131 B2 | 3/2012 | Komatsu et al. | |
| 2008/0067330 A1 * | 3/2008 | Yamamoto | G01J 3/51 250/226 |

(Continued)

FOREIGN PATENT DOCUMENTS

| | | |
|---|---|---|
| CN | 102097445 A | 6/2011 |
| CN | 104167420 A | 11/2014 |

(Continued)

OTHER PUBLICATIONS

Japanese Office Action dated Sep. 26, 2016, as issued in corresponding Japan Patent Application No. 2015-182771 (with English translation—8 pages).

(Continued)

*Primary Examiner* — Galina G Yushina
(74) *Attorney, Agent, or Firm* — Muncy, Geissler, Olds & Lowe, P.C.

(57) ABSTRACT

An image sensor is provided. The image sensor includes a semiconductor substrate containing a plurality of photoelectric conversion elements. A color filter array is disposed above the semiconductor substrate. The color filter array includes a first color filter, a second color filter and a third color filter. The image sensor further includes an isolated partition disposed in the color filter array to surround one of the first, second and third color filters. The isolated partition has a refractive index that is lower than the refractive indexes of the first, second and third color filters.

7 Claims, 25 Drawing Sheets

(56) References Cited

U.S. PATENT DOCUMENTS

| | | | | |
|---|---|---|---|---|
| 2010/0289885 A1* | 11/2010 | Lu | ............ | H04N 5/2258 |
| | | | | 348/61 |
| 2012/0268631 A1* | 10/2012 | Takase | ............ | G02B 3/0068 |
| | | | | 348/273 |
| 2012/0313206 A1* | 12/2012 | Nozaki | ............ | H01L 27/14621 |
| | | | | 257/432 |
| 2012/0320242 A1 | 12/2012 | Ogita et al. | | |
| 2013/0293751 A1* | 11/2013 | Vaartstra | ............ | H01L 27/14625 |
| | | | | 348/280 |
| 2014/0339606 A1* | 11/2014 | Lin | ............ | H01L 27/14685 |
| | | | | 257/228 |

FOREIGN PATENT DOCUMENTS

| | | |
|---|---|---|
| JP | 2006-237737 A | 9/2006 |
| JP | 2010-186818 A | 8/2010 |
| JP | 2013-125933 A | 6/2013 |
| JP | 2013-165216 A | 8/2013 |
| JP | 2014-225667 A | 5/2014 |
| JP | 2015-012619 A | 1/2015 |

OTHER PUBLICATIONS

Japanese Office Action of corresponding JP application No. 2015-182771 dated Apr. 24, 2017 and its English translation; pp. 1-20.
Office Action and Search Report dated Jun. 4, 2018 in corresponding CN Application 201510661505.7, 7 pages.

\* cited by examiner

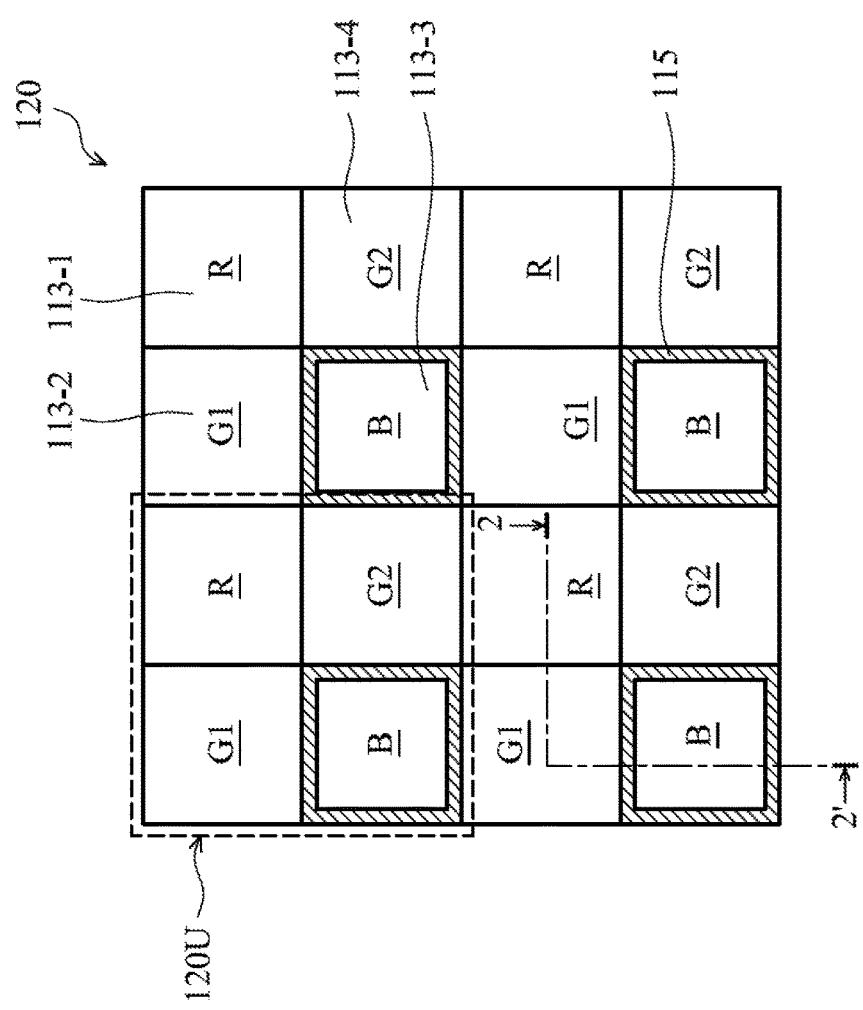

IMAGE SENSORS

BACKGROUND

Field of the Invention

The disclosure relates to image sensors, and more particularly to image sensors having isolated partitions in a filter array.

Description of the Related Art

Recently, image sensors have been widely used in various image-capturing apparatuses, for example video cameras, digital cameras and the like. Image sensors, such as charge-coupled device (CCD) image sensors or complementary metal-oxide semiconductor (CMOS) image sensors, have photoelectric converters for converting incident light into electric signals. The image sensors have a pixel array and each pixel has one photoelectric converter. The image sensors also have logic circuits for transmitting and processing the electric signals.

Moreover, image sensors usually have a color filter layer for generating color images. The color filter layer may contain a primary-color filter of red (R), blue (B) and green (G) segments stacked over the light-receiving surface of two-dimensionally arranged photoelectric converters. The color filter layer has a predetermined pattern such that each of the color segments corresponds to one photoelectric converter.

In some examples, the red (R), blue (B) and green (G) segments are connected together to form a connected color filter layer. The pixels of the image sensors corresponding to the red (R), blue (B) and green (G) segments of the connected color filter layer, respectively, have different quantum efficiencies (QE). In some other examples, a grid structure is disposed between the red (R), blue (B) and green (G) segments to form a discontinuous color filter layer. The pixels of the image sensors corresponding to the red (R), blue (B) and green (G) segments of the discontinuous color filter layer, respectively, also have different quantum efficiencies (QE).

The quality of the image sensors is indicated by many characteristics, such as dynamic range, sensitivity, responsiveness, uniformity, etc. When an image of an object is captured under a transfer between high and low illumination intensities using the image sensor, the dynamic range is particularly important. There is a need to enhance the quantum efficiency (QE) of the pixels of the image sensors for high dynamic range application.

BRIEF SUMMARY

According to embodiments of the disclosure, image sensors have isolated partitions disposed in a filter array to surround one kind of filter elements of the filter array. The quantum efficiency (QE) of the pixels of the image sensors corresponding to the one kind of the filter elements surrounded by the isolated partitions is enhanced thereby. Therefore, the image sensors of the disclosure are suitable for high dynamic range application.

In some embodiments, an image sensor is provided. The image sensor includes a semiconductor substrate containing a plurality of photoelectric conversion elements. The image sensor also includes a color filter array disposed above the semiconductor substrate. The color filter array includes a first color filter, a second color filter and a third color filter. The image sensor further includes an isolated partition disposed in the color filter array to surround one of the first, second and third color filters. The isolated partition has a refractive index that is lower than the refractive indexes of the first, second and third color filters.

In some other embodiments, an image sensor is provided. The image sensor includes a semiconductor substrate containing a plurality of photoelectric conversion elements. The image sensor also includes a filter array disposed above the semiconductor substrate. The filter array includes a first color filter, a second color filter, a third color filter and an infrared filter. The image sensor further includes an isolated partition disposed in the filter array to surround one of the first, second and third color filters and the infrared filter. The isolated partition has a refractive index that is lower than the refractive indexes of the first, second and third color filters and is also lower than the refractive index of the infrared filter.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein:

FIG. 2A shows a partial plane view of a color filter array of an image sensor according to some embodiments;

DETAILED DESCRIPTION

The following description is of the contemplated mode of carrying out the disclosure. This description is made for the purpose of illustrating the general principles of the disclosure and should not be taken in a limiting sense. The scope of the disclosure is best determined by reference to the appended claims.

Figure 1A:
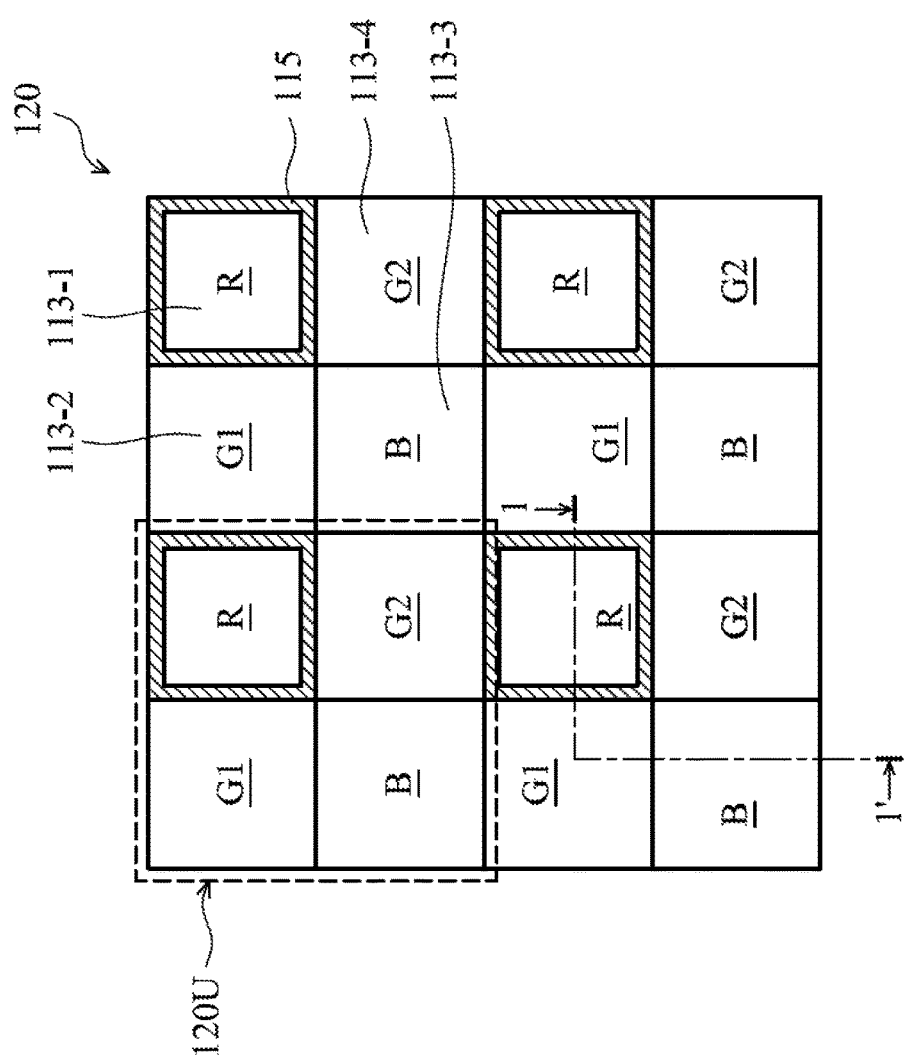
FIG. 1A shows a partial plane view of a color filter array of an image sensor according to some embodiments.

Referring to FIG. 1A, a partial plane view of a color filter array 120 of an image sensor according to some embodiments is shown. In some embodiments, the color filter array 120 is arranged with one red (R) color filter 113-1, two green (G1, G2) color filters 113-2, 113-4 and one blue (B) color filter 113-3 in a repeat unit 120U of the color filter array 120. In some embodiments, an isolated partition 115 is disposed in the color filter array 120 to surround the red color filter 113-1 in the repeat unit 120U. The blue color filter 113-3 is in contact with the two green color filters 113-2 and 113-4. As shown in FIG. 1A, from a top view, the isolated partitions 115 in the color filter array 120 are not connected with each other.

Figure 1B:
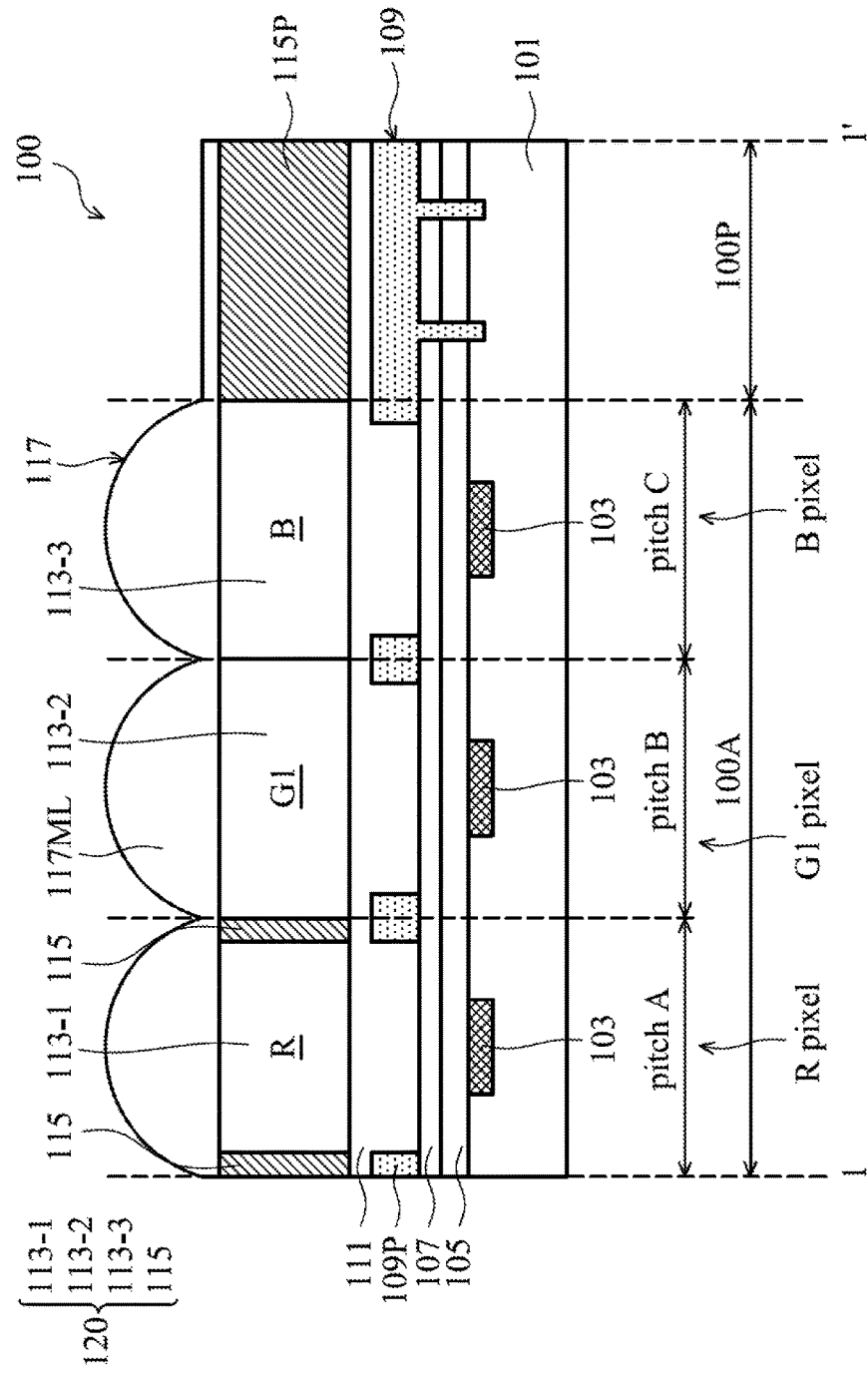
FIG. 1B shows a partial cross section of an image sensor along a line 1-1' of FIG. 1A according to some embodiments.

FIG. 1B shows a partial cross section of an image sensor 100 along a line 1-1' shown in FIG. 1A according to some embodiments. In some embodiments, the image sensor 100 is a complementary metal-oxide semiconductor (CMOS) image sensor (CIS). The image sensor 100 includes a semiconductor substrate 101, for example a silicon wafer or a chip. The semiconductor substrate 101 contains a plurality of photoelectric conversion elements 103, such as photodiodes. The image sensor 100 has a number of pixels arranged in a pixel array. Each of the photoelectric conversion elements 103 is disposed in one respective pixel. Moreover, the photoelectric conversion elements 103 are isolated from each other. Although FIG. 1B shows three pixels, actually the image sensor 100 has several million or more pixels. The pixels of the image sensor 100 have the same size in area and in pitch. For example, the R, G1, B pixels shown in FIG. 1B have the same size in area and the pitches A, B and C of the R, G1, B pixels are equal.

The back surface of the semiconductor substrate 101 usually has photoelectric conversion elements 103 formed thereon. The front surface of the semiconductor substrate 101 usually has a wiring layer (not shown in FIG. 1B) of various wiring lines and electronic circuits required for the image sensor 100 formed thereon. In some embodiments, the image sensor 100 is a backside illumination (BSI) image sensor. In the BSI image sensor, the back surface of the semiconductor substrate 101 having the photoelectric conversion elements 103 formed thereon is close to the light receiving surface of the image sensor 100. The front surface of the semiconductor substrate 101 having the wiring layer formed thereon is far from the light receiving surface of the image sensor 100.

In some other embodiments, the image sensor 100 is a front-side illumination (FSI) image sensor. In the FSI image sensor, the front surface of the semiconductor substrate 101 having the wiring layer formed thereon is close to the light receiving surface of the image sensor 100. The back surface of the semiconductor substrate 101 having the photoelectric conversion elements formed thereon is far from the light receiving surface of the image sensor 100.

As shown in FIG. 1B, in some embodiments, the image sensor 100 further includes a high dielectric-constant (high-k) film 105 formed on the semiconductor substrate 101 and covering the photoelectric conversion elements 103. The high-k film 105 can be made of hafnium oxide ($HfO_2$), hafnium tantalum oxide (HfTaO), hafnium titanium oxide (HfTiO), hafnium zirconium oxide (HfZrO), tantalum pentoxide ($Ta_2O_5$) or other suitable high-k dielectric materials by a deposition process. The high-k film 105 has a high-refractive index and a light-absorbing ability. In some embodiments, the image sensor 100 also includes a buffer layer 107 formed on the high-k film 105. The buffer layer 107 can be made of silicon oxides, silicon nitrides, silicon oxynitrides, or other suitable insulating materials by a deposition process.

In some embodiments, the image sensor 100 includes a light-shielding layer 109 formed on the buffer layer 107 and underneath a color filter array 120. The light-shielding layer 109 includes a plurality of light-shielding partitions 109P disposed between the pixels of the image sensor 100. From a top view, the light-shielding partitions 109P constitute a grid structure. In some embodiments, the light-shielding layer 109 is made of metal and the light-shielding partitions 109P can be referred to as a metal grid.

In some embodiments, the image sensor 100 further includes a passivation layer 111 formed on the buffer layer 107. The passivation layer 111 also covers the light-shielding layer 109 and has a flat top surface. The passivation layer 111 can be made of silicon oxides, silicon nitrides, silicon oxynitrides, and other suitable insulating materials by a deposition process.

In some embodiments, the color filter array 120 shown in FIG. 1A is formed on the flat top surface of the passivation layer 111. The color filter array 120 includes a first color filter, a second color filter and a third color filter these are different in color and are disposed above the semiconductor substrate 101. For example, the first, second, and third color filters are a red (R) color filter 113-1, a green (G1 or G2) color filter 113-2 or 113-4 and a blue (B) color filter 113-3, respectively. The green (G1, G2) color filters 113-2 and 113-4 shown in FIG. 1A are the same color. The symbols G1 and G2 are used to label different positions of the green color filters 113-2 and 113-4. As shown in FIG. 1B, each color filter of the color filter array 120 is disposed in one respective pixel of the image sensor 100.

As shown in FIGS. 1A and 1B, in some embodiments, the isolated partition 115 is disposed in the color filter array 120 to surround the red color filter 113-1. The isolated partition 115 has a refractive index that is lower than the refractive indexes of the red (R) color filter 113-1, the green (G1, G2) color filters 113-2 and 113-4 and the blue (B) color filter 113-3 of the color filter array 120. In some embodiments, the isolated partition 115 is made of silicon oxide that has a refractive index of about 1.3 to about 1.4. The red (R) color filter 113-1, the green (G1, G2) color filters 113-2 and 113-4 and the blue (B) color filter 113-3 have refractive indexes of, but not limited to, about 1.6 to about 1.9.

Figure 1C:
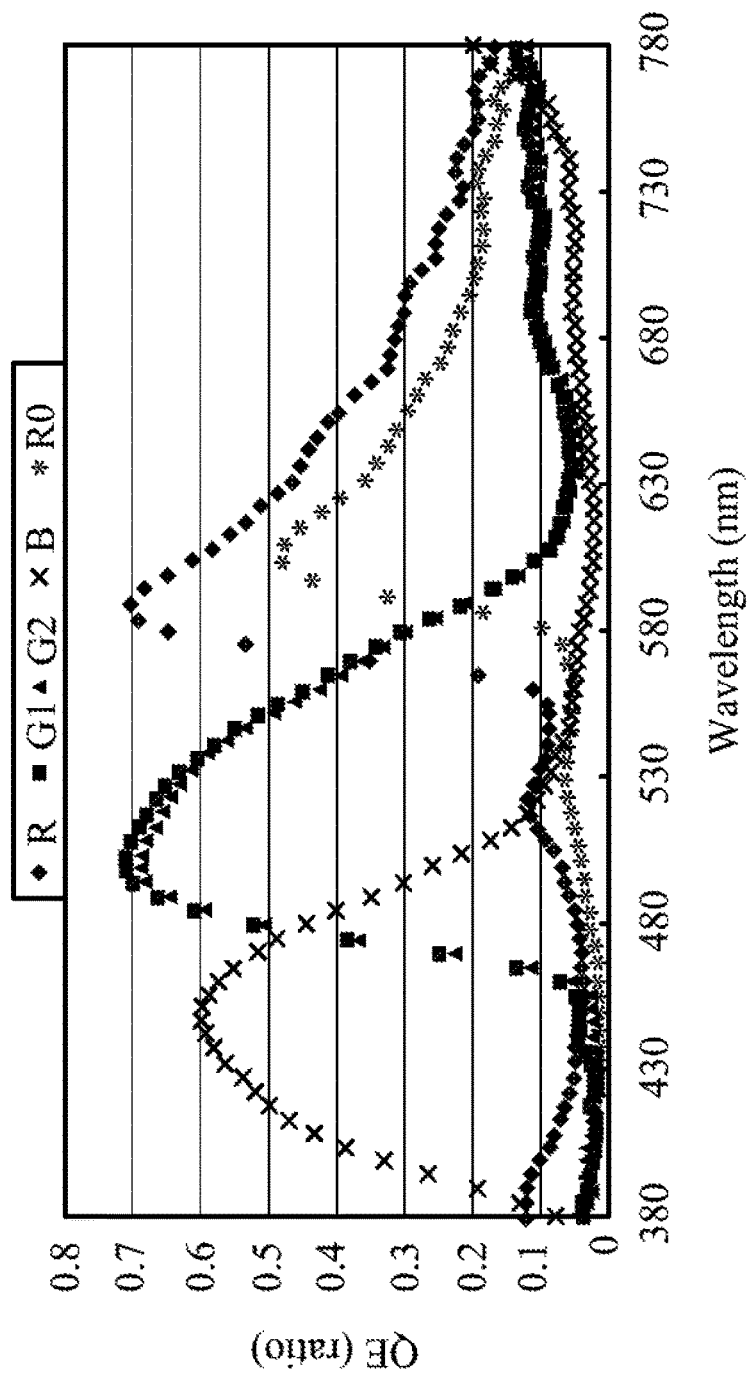
FIG. 1C shows a graph of QE vs. wavelength curves of R, G1, G2, B pixels of the image sensor shown in FIGS. 1A-1B according to some embodiments and a comparative curve for the R pixel.

FIG. 1C shows a graph of QE vs. wavelength curves R, G1, G2, B of the R, G1, G2, B pixels of the image sensor 100 shown in FIGS. 1A-1B according to some embodiments. FIG. 1C also shows a comparative curve R0 for the R pixel. The comparative curve R0 is obtained from an R pixel of an image sensor without an isolated partition to surround a red color filter. The curve R is obtained from the R pixel of the image sensor 100 which has the isolated partition 115 to surround the red (R) color filter 113-1. As shown in FIG. 1C, the QE of the curve R is higher than that of the comparative curve R0. This means that the isolated partition 115 surrounding the red (R) color filter 113-1 can enhance the QE of the R pixels of the image sensor 100. The isolated partition 115 having a refractive index that is lower than the refractive index of the red (R) color filter 113-1 can constitute a total reflective structure on the interface between the isolated partition 115 and the red (R) color filter 113-1. Thus, according to some embodiments, a QE peak adjustment of the R pixels of the image sensor 100 is achieved for a high dynamic range application, such as for surveillance applications.

In addition, as shown in FIG. 1B, the material of forming the isolated partition 115 is also formed on the passivation layer 111 in a peripheral area 100P of the image sensor 100 to be an extended portion 115P. The peripheral area 100P surrounds an active area 100A of the image sensor 100. The active area 100A has the photoelectric conversion elements 103 disposed therein. In some embodiments, the isolated partition 115 and the extended portion 115P are level with the red (R) color filter 113-1, the green (G1, G2) color filters 113-2 and 113-4 and the blue (B) color filter 113-3.

Furthermore, as shown in FIGS. 1A and 1B, one isolated partition 115 is completely disposed in one pixel. Thus, an area of one isolated partition 115 and one color filter surrounded by the isolated partition 115 added together is equal to the area of the other one color filter that is not surrounded by the isolated partition 115. For example, the area of one isolated partition 115 and one red (R) color filter 113-1 added together is equal to the area of one green (G1 or G2) color filter 113-2 or 113-4, or one blue (B) color filter 113-3.

Referring to FIG. 1B, the image sensor 100 further includes a microlens structure 117 disposed above the color filter array 120. The microlens structure 117 includes a plurality of microlens elements 117ML. Each of the microlens elements 117ML corresponds to one respective color filter of the color filter array 120.

Figure 2B:
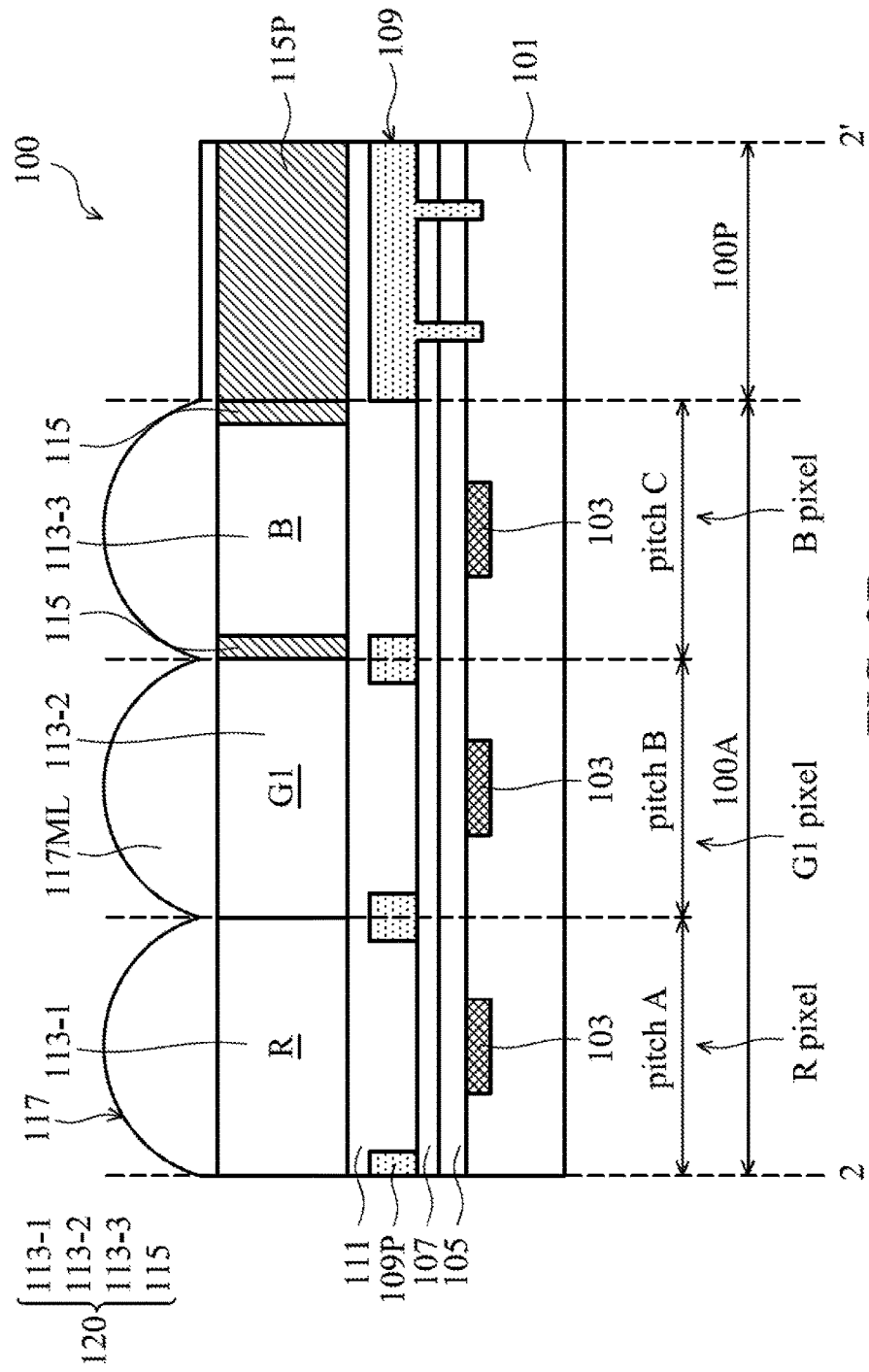
FIG. 2B shows a partial cross section of an image sensor along a line 2-2' of FIG. 2A according to some embodiments.

FIG. 2A shows a partial plane view of a color filter array 120 of an image sensor according to some embodiments. FIG. 2B is a partial cross section of an image sensor 100 along a line 2-2' shown in FIG. 2A according to some embodiments. In the embodiments of FIGS. 2A-2B, an isolated partition 115 is disposed in the color filter array 120 to surround the blue color filter 113-3 in the repeat unit 120U. The red color filter 113-1 is in contact with the two green color filters 113-2 and 113-4. As shown in FIG. 2A, from a top view, the isolated partitions 115 in the color filter array 120 are not connected with each other. The other elements of the image sensor 100 shown in the embodiments of FIG. 2B can be the same as those of FIG. 1B.

Figure 2C:
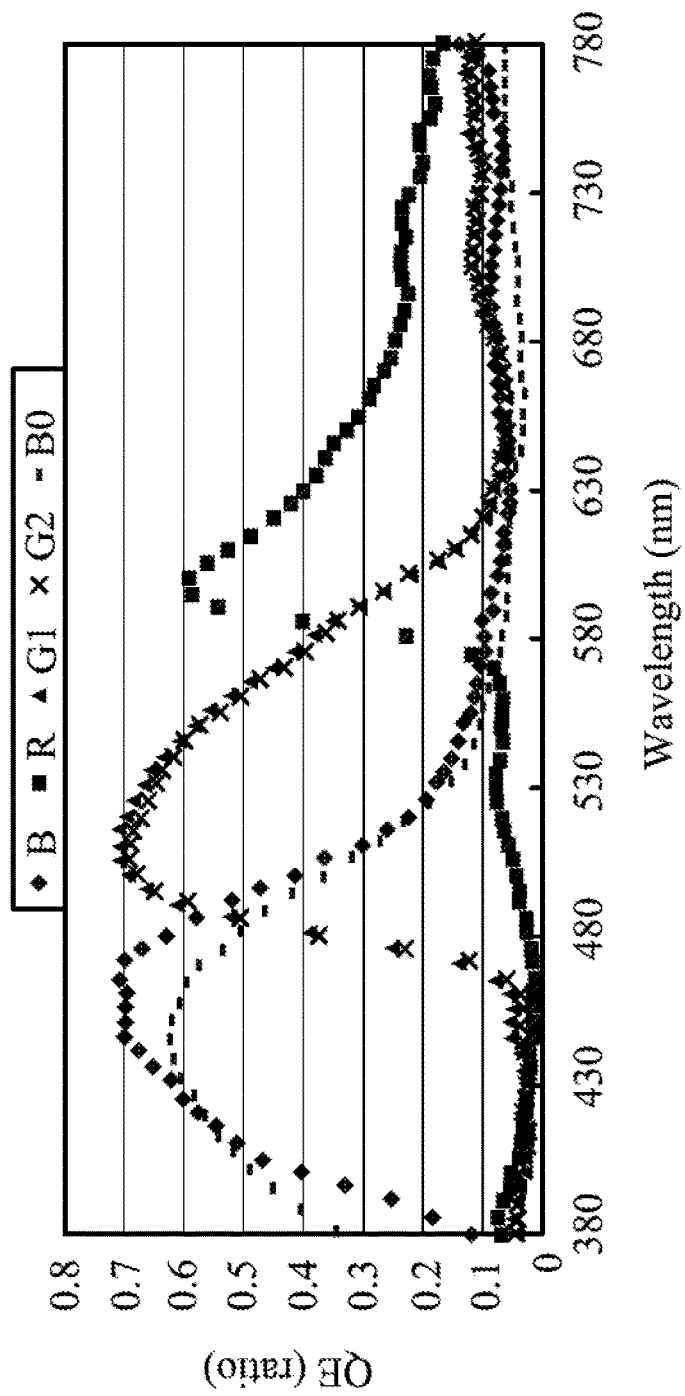
FIG. 2C shows a graph of QE vs. wavelength curves of R, G1, G2, B pixels of the image sensor shown in FIGS. 2A-2B according to some embodiments and a comparative curve for the B pixel.

FIG. 2C is a graph of QE vs. wavelength curves R, G1, G2, B of the R, G1, G2, B pixels of the image sensor 100 shown in FIGS. 2A-2B according to some embodiments. FIG. 2C also shows a comparative curve B0 for the B pixel. The comparative curve B0 is obtained from a B pixel of an image sensor without an isolated partition to surround a blue color filter. The curve B is obtained from the B pixel of the image sensor 100 which has the isolated partition 115 to surround the blue (B) color filter 113-3. As shown in FIG. 2C, the QE of the curve B is higher than that of the comparative curve B0. This means that the isolated partition 115 surrounding the blue (B) color filter 113-3 can enhance the QE of the B pixels of the image sensor 100. The isolated partition 115 having a refractive index that is lower than the refractive index of the blue (B) color filter 113-3 can constitute a total reflective structure on the interface between the isolated partition 115 and the blue (B) color filter 113-3. Thus, according to some embodiments, a QE peak adjustment of the B pixels of the image sensor 100 is achieved for high dynamic range application.

Figure 3A:
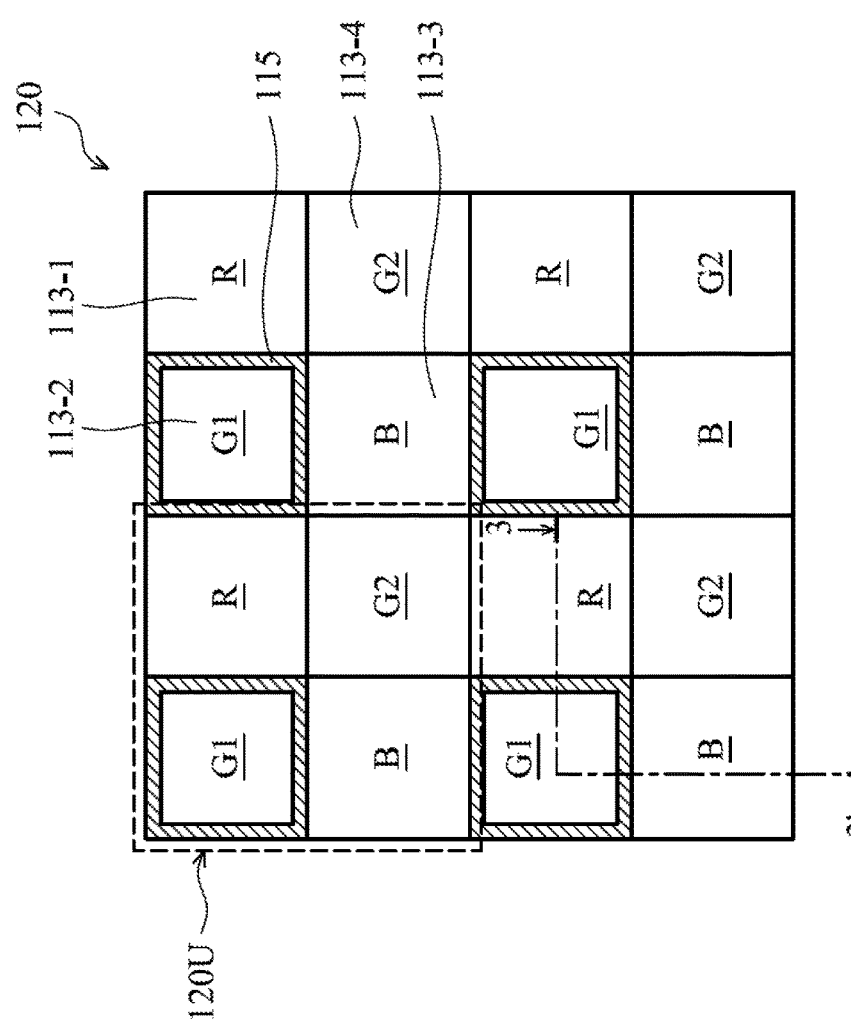
FIG. 3A shows a partial plane view of a color filter array of an image sensor according to some embodiments.
Figure 3B:
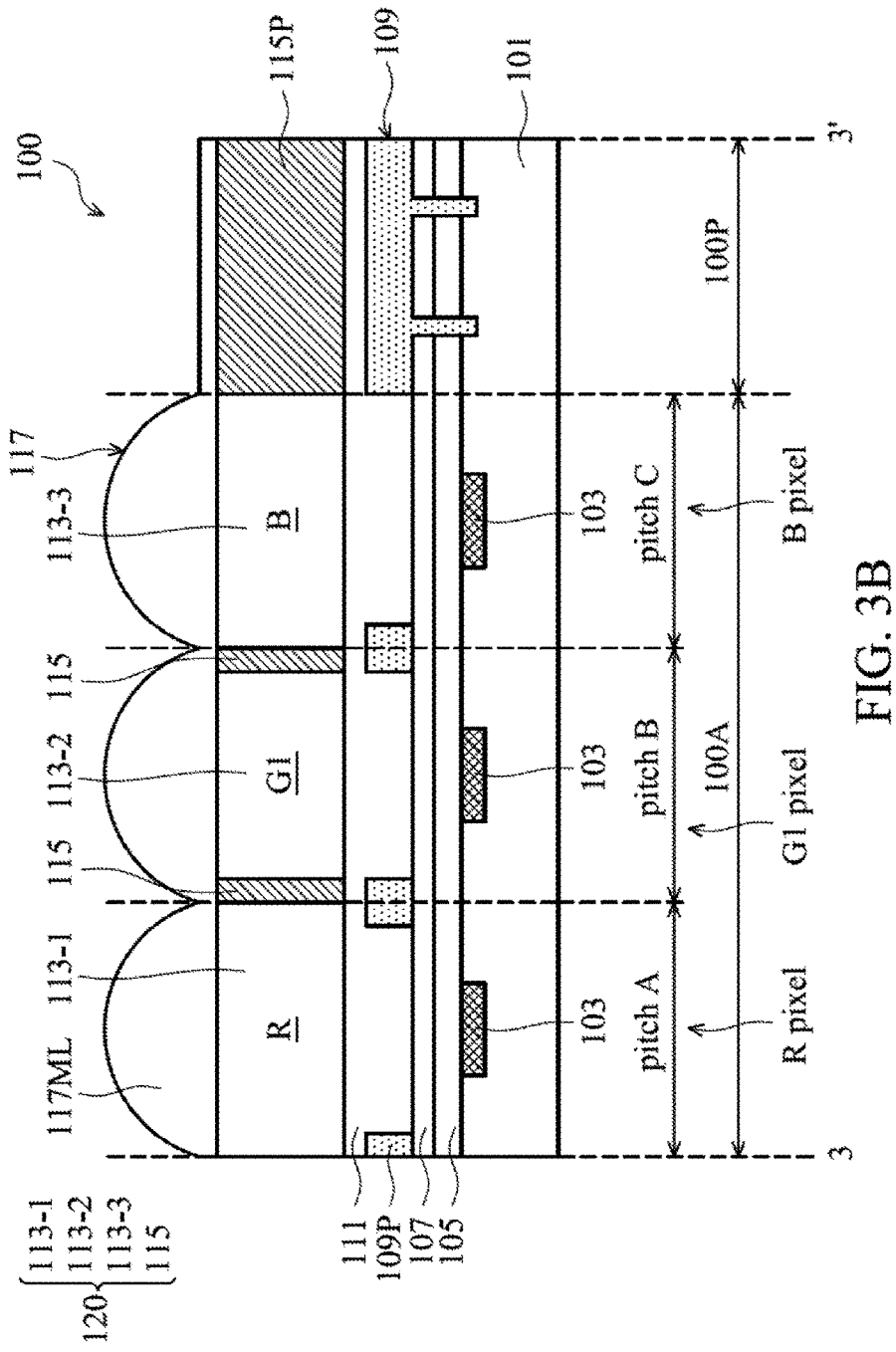
FIG. 3B shows a partial cross section of an image sensor along a line 3-3' of FIG. 3A according to some embodiments.

FIG. 3A shows a partial plane view of a color filter array 120 of an image sensor according to some embodiments. FIG. 3B is a partial cross section of an image sensor 100 along a line 3-3' shown in FIG. 3A according to some embodiments. In the embodiments of FIGS. 3A-3B, an isolated partition 115 is disposed in the color filter array 120 to surround one of the two green (G1, G2) color filters 113-2 and 113-4. For example, the isolated partition 115 surrounds the green (G1) color filter 113-2 in the repeat unit 120U. The other green (G2) color filter 113-4 is in contact with the red color filter 113-1 and the blue color filter 113-3. As shown in FIG. 3A, from a top view, the isolated partitions 115 in the color filter array 120 are not connected with each other. The other elements of the image sensor 100 show in the embodiments of FIG. 3B can be the same as those of FIG. 1B.

Figure 3C:
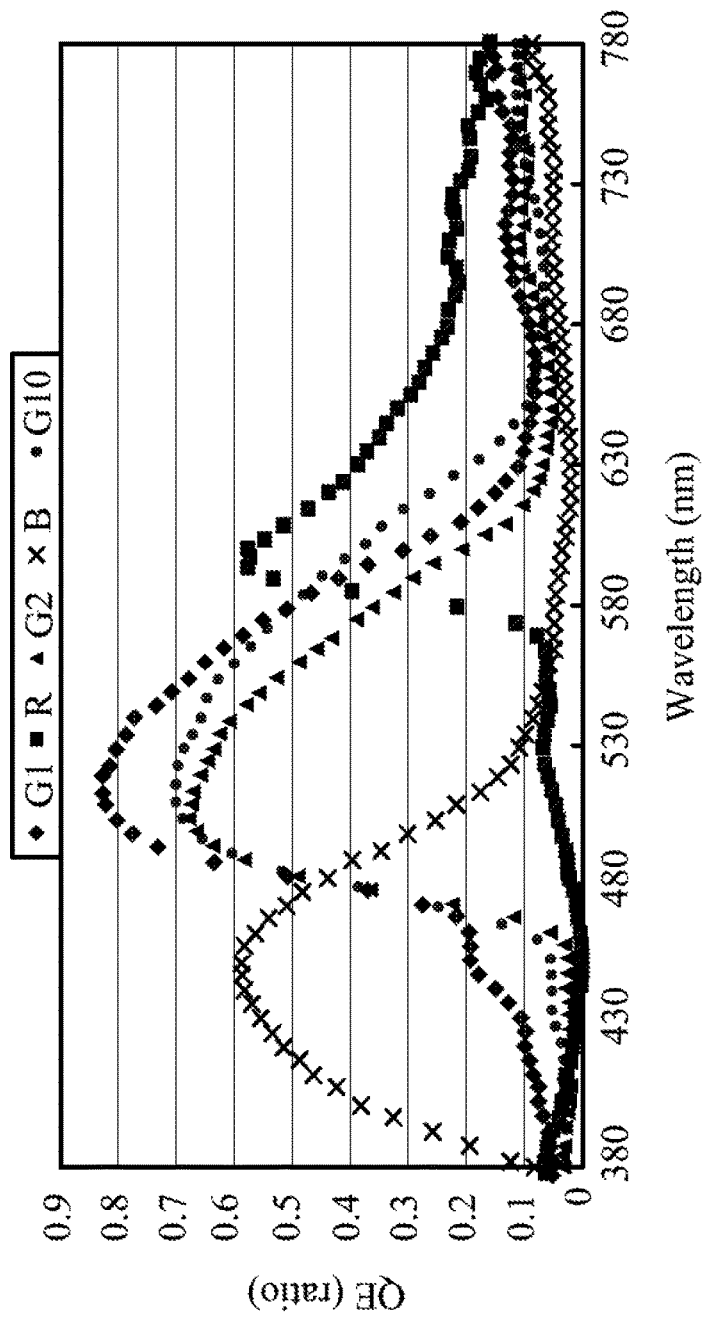
FIG. 3C shows a graph of QE vs. wavelength curves of R, G1, G2, B pixels of the image sensor shown in FIGS. 3A-3B according to some embodiments and a comparative curve for the G1 pixel.

FIG. 3C is a graph of QE vs. wavelength curves R, G1, G2, B of the R, G1, G2, B pixels of the image sensor 100 shown in FIGS. 3A-3B according to some embodiments. FIG. 3C also shows a comparative curve G10 for the G1 pixel. The comparative curve G10 is obtained from a G1 pixel of an image sensor without an isolated partition to surround a G1 color filter. The curve G1 is obtained from the G1 pixel of the image sensor 100 which has the isolated partition 115 to surround the green (G1) color filter 113-2. As shown in FIG. 3C, the QE of the curve G1 is higher that that of the comparative curve G10. This means that the isolated partition 115 surrounding the green (G1) color filter 113-2 can enhance the QE of the G1 pixels of the image sensor 100. The isolated partition 115 having a refractive index that is lower than the refractive index of the green (G1) color filter 113-2 can constitute a total reflective structure on the interface between the isolated partition 115 and the green (G1) color filter 113-2. Thus, according to some embodiments, a QE peak adjustment of the G1 pixels of the image sensor 100 is achieved for high dynamic range application.

In some embodiments, the red, green, blue color filters of the color filter array 120 can be arranged in various patterns different from that of FIGS. 1A, 2A and 3A. In some other embodiments, the color filter array 120 may further include a white (W) color filter (not shown). The red, green, blue color filters and the white (W) color filter can be arranged in various patterns. Moreover, the isolated partition surrounds one kind of the color filters of the color filter array.

Figure 4A:
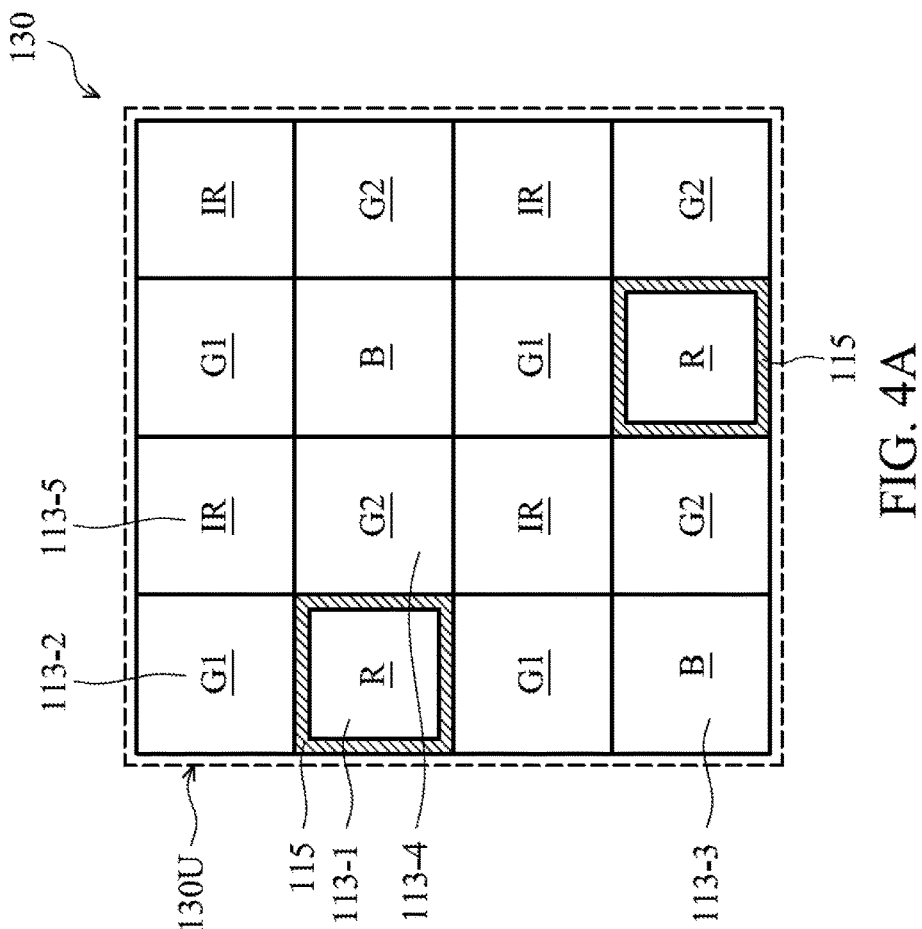
FIGS. 4A-4E show various partial plane views of a repeat unit of a filter array of an image sensor according to some embodiments.

FIGS. 4A-4E show partial plane views of a repeat unit 130U of a filter array 130 of an image sensor according to some embodiments. The filter array 130 includes a first color filter, a second color filter and a third color filter these are different in color, and further includes an infrared (IR) filter. In some embodiments, the filter array 130 is arranged with eight green (G1 and G2) color filters 113-2 and 113-4, four infrared (IR) filters 113-5, two red (R) color filters 113-1 and two blue (B) color filters 113-3 in the repeat unit 130U of the filter array 130. As shown in FIG. 4A, in some embodiments, two isolated partitions 115 are disposed in the repeat unit 130U of the filter array 130 to surround the two red (R) color filters 113-1. The green (G1 or G2) color filter 113-2 or 113-4 is in contact with the blue (B) color filter 113-3 and the infrared (IR) filter 113-5.

Figure 4B:
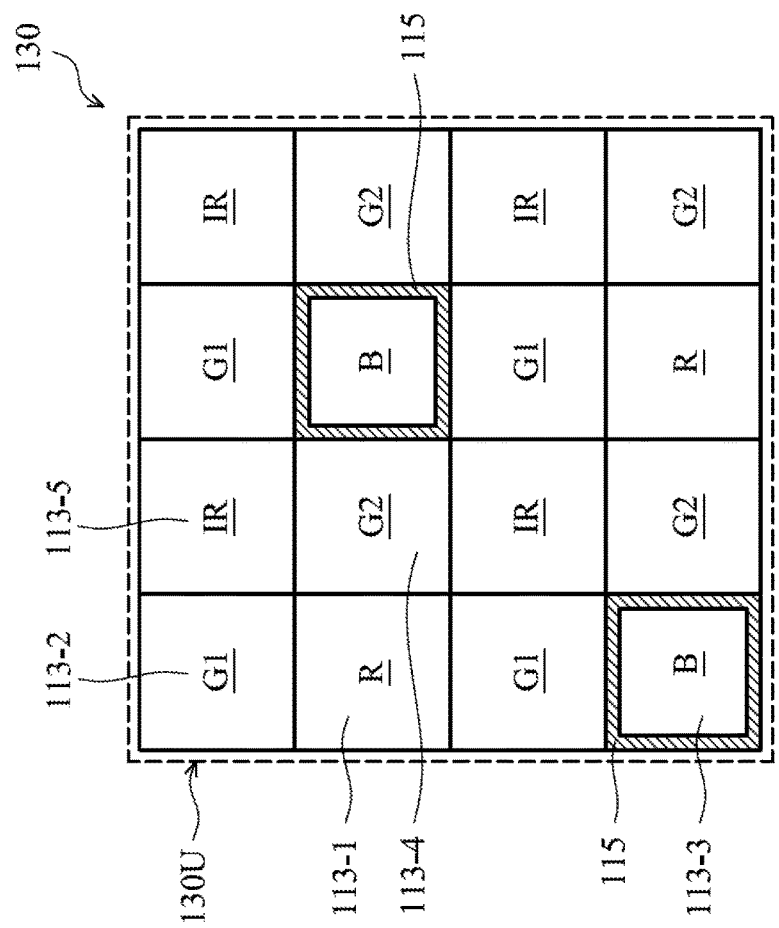

As shown in FIG. 4B, in some embodiments, two isolated partitions 115 are disposed in the repeat unit 130U of the filter array 130 to surround the two blue (B) color filters 113-3. The green (G1 or G2) color filter 113-2 or 113-4 is in contact with the red (R) color filter 113-1 and the infrared (IR) filter 113-5.

Figure 4C:
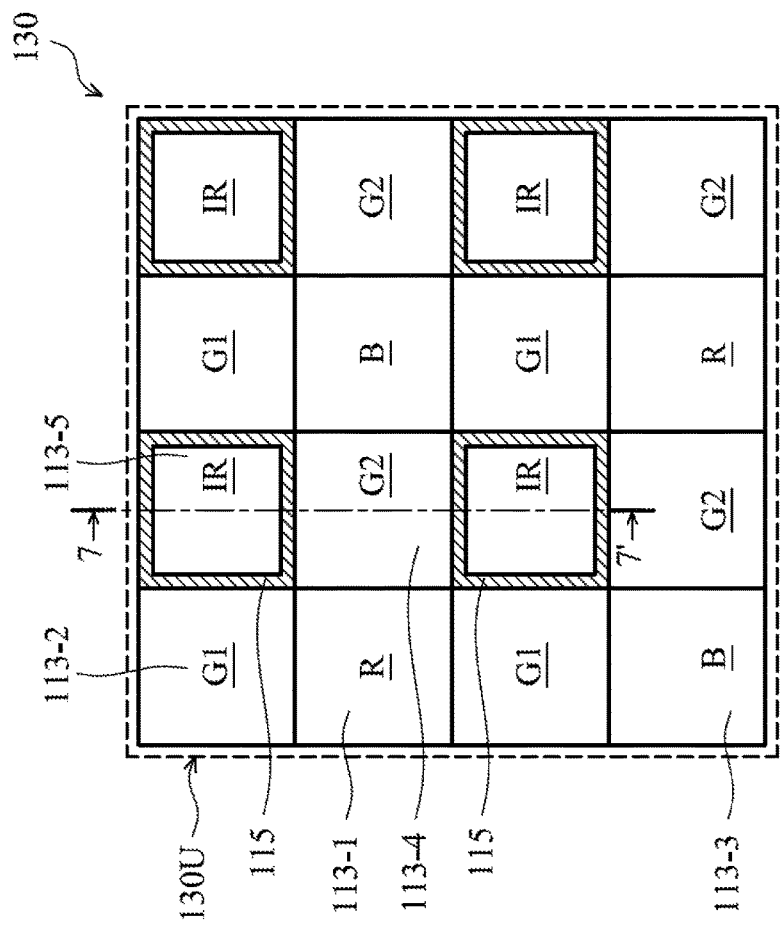

As shown in FIG. 4C, in some embodiments, four isolated partitions 115 are disposed in the repeat unit 130U of the filter array 130 to surround the four infrared (IR) filters 113-5. The green (G1 or G2) color filter 113-2 or 113-4 is in contact with the red (R) color filter 113-1 and the blue (B) color filter 113-3.

Figure 4D:
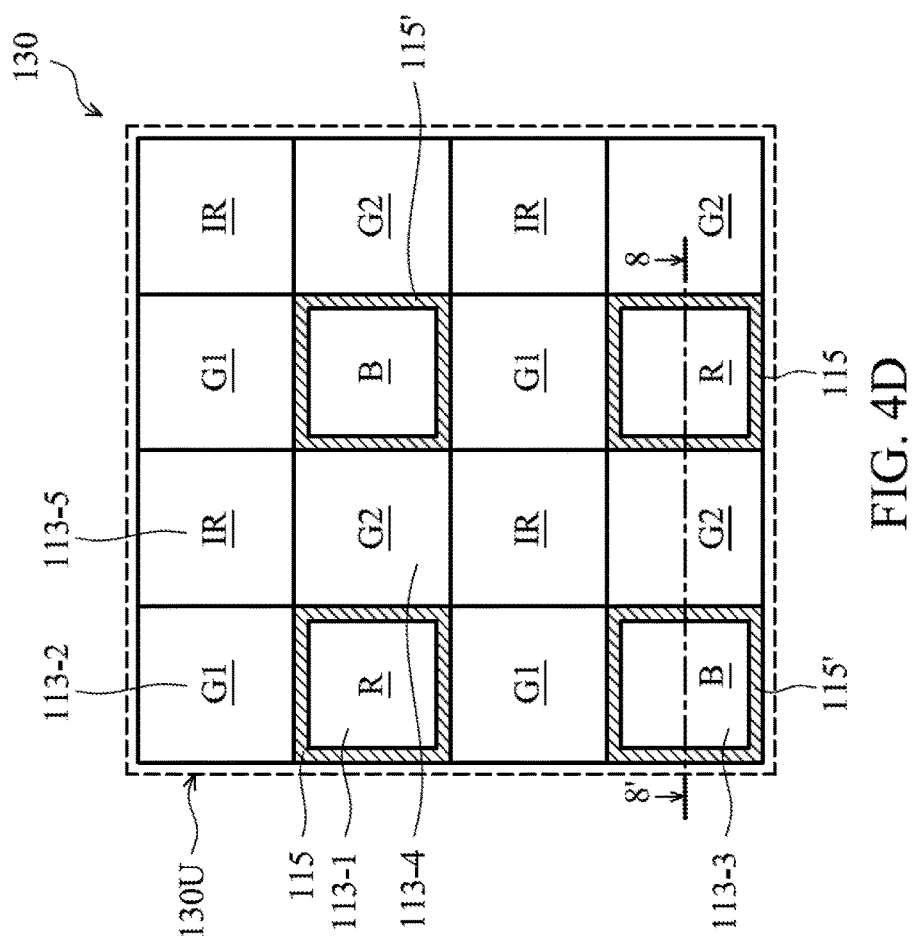

As shown in FIG. 4D, in some embodiments, two isolated partitions 115 are disposed in the repeat unit 130U of the filter array 130 to surround the two red (R) color filters 113-1. Moreover, two additional isolated partitions 115' are disposed in the repeat unit 130U of the filter array 130 to surround the two blue (B) color filters 113-3. The infrared (IR) filter 113-5 is in contact with the green (G1, G2) color filters 113-2 and 113-4.

Figure 4E:
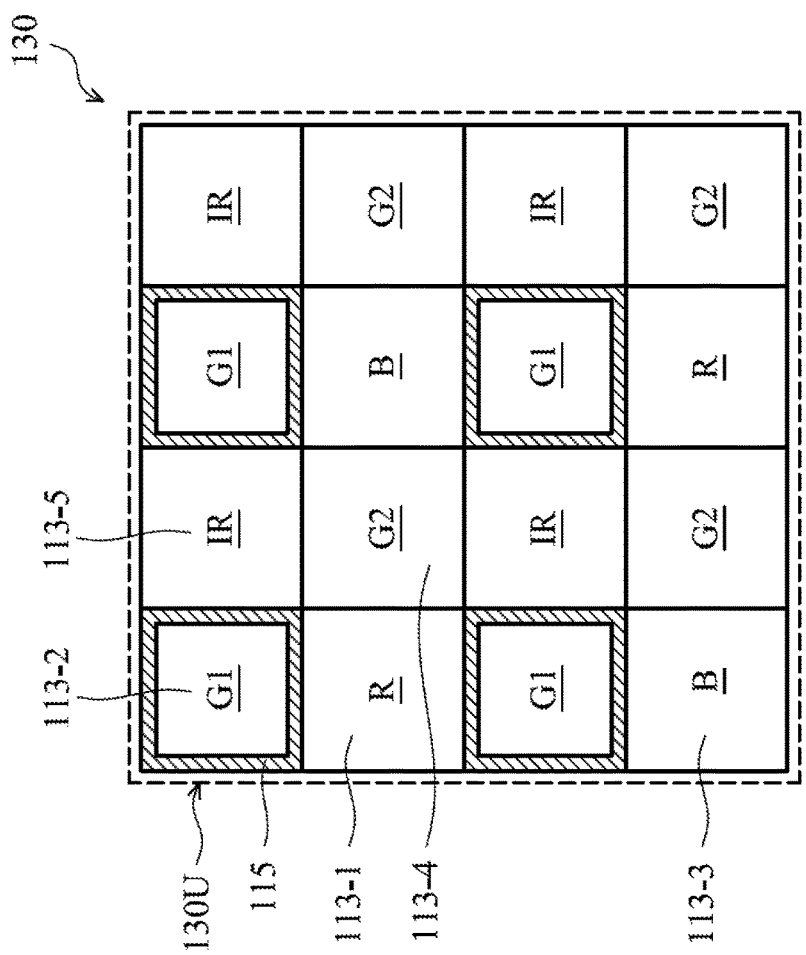

As shown in FIG. 4E, in some embodiments, four isolated partitions 115 are disposed in the repeat unit 130U of the filter array 130 to surround the four green (G1) color filters 113-2. In some other embodiments, four isolated partitions 115 are disposed in the repeat unit 130U of the filter array 130 to surround the four green (G2) color filters 113-4.

As shown in FIGS. 4A-4E, from a top view, the isolated partitions 115 or the isolated partitions 115 added with the additional isolated partitions 115' in the filter array 130 are not connected with each other.

Moreover, the isolated partitions 115 and the additional isolated partitions 115' of FIGS. 4A-4E are made of the same material and have the same refractive index that is lower than the refractive indexes of the red (R), green (G1, G2) and blue (B) color filters 113-1, 113-2, 113-4, 113-3 and is also lower than the refractive index of the infrared (IR) filter 113-5. Therefore, for an image sensor including the repeat unit 130U of the filter array 130 shown in FIG. 4A, the QE of the R pixels of the image sensor is enhanced. For an image sensor including the repeat unit 130U of the filter array 130 shown in FIG. 4B, the QE of B pixels of the image sensor is enhanced. For an image sensor including the repeat unit 130U of the filter array 130 shown in FIG. 4C, the QE of IR pixels of the image sensor is enhanced. For an image sensor including the repeat unit 130U of the filter array 130 shown in FIG. 4D, both the QE of R pixels and the QE of B pixels of the image sensor are enhanced. For an image sensor including the repeat unit 130U of the filter array 130 shown in FIG. 4E, the QE of G1 pixels of the image sensor is enhanced.

Figure 5A:
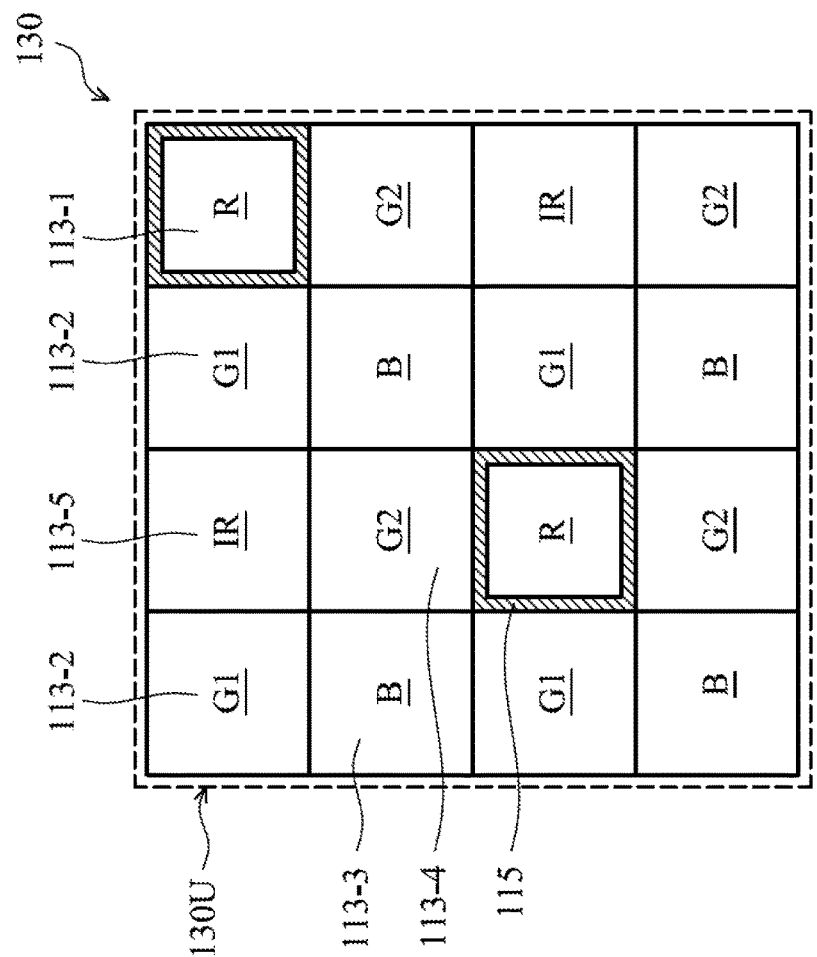
FIGS. 5A-5E show various partial plane views of a repeat unit of a filter array of an image sensor according to some other embodiments.

FIGS. 5A-5E show partial plane views of a repeat unit 130U of a filter array 130 of an image sensor according to some embodiments. The filter array 130 includes a first color filter, a second color filter and a third color filter these are different in color, and further includes an infrared (IR) filter. In some embodiments, the filter array 130 is arranged with eight green (G1 and G2) color filters 113-2 and 113-4, four blue (B) color filters 113-3, two red (R) color filters 113-1 and two infrared (IR) filters 113-5 in the repeat unit 130U of the filter array 130. As shown in FIG. 5A, in some embodiments, two isolated partitions 115 are disposed in the repeat unit 130U of the filter array 130 to surround the two red (R) color filters 113-1. The green (G1 or G2) color filter 113-2 or 113-4 is in contact with the blue (B) color filter 113-3 and the infrared (IR) filter 113-5.

Figure 5B:
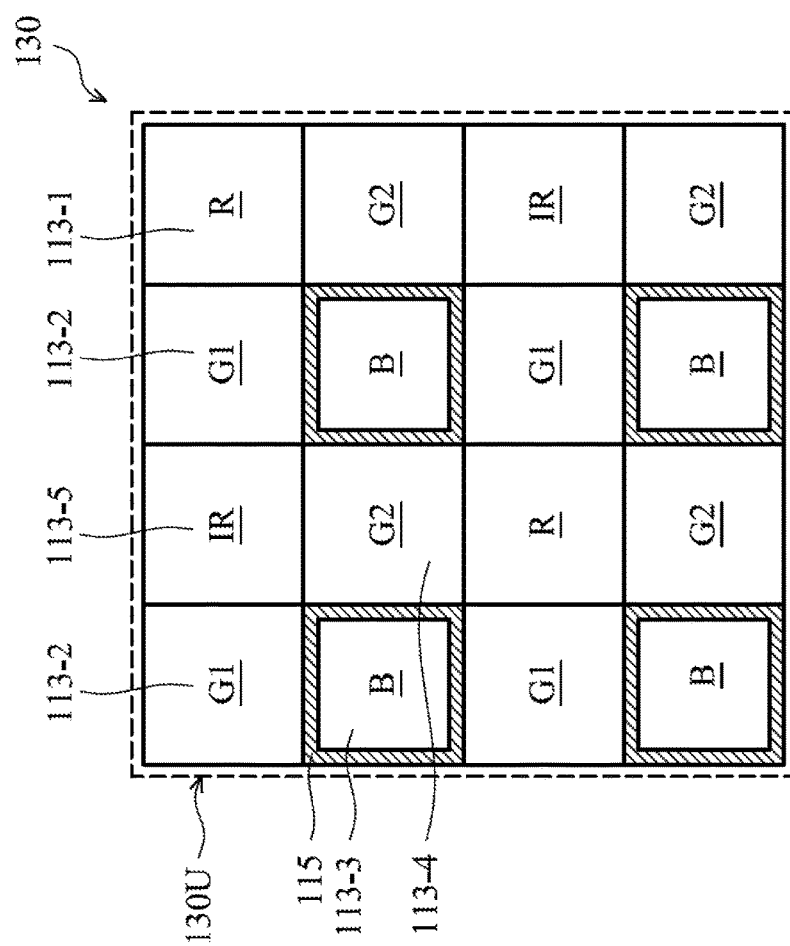

As shown in FIG. 5B, in some embodiments, four isolated partitions 115 are disposed in the repeat unit 130U of the filter array 130 to surround the four blue (B) color filters 113-3. The green (G1 or G2) color filter 113-2 or 113-4 is in contact with the red (R) color filter 113-1 and the infrared (IR) filter 113-5.

Figure 5C:
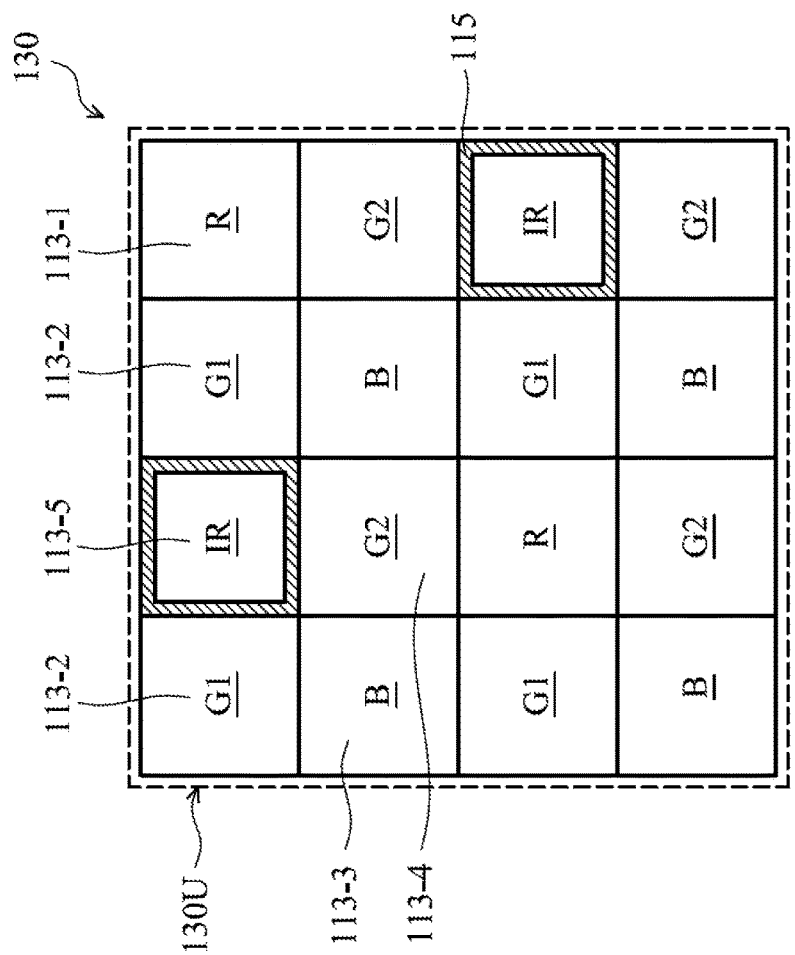

As shown in FIG. 5C, in some embodiments, two isolated partitions 115 are disposed in the repeat unit 130U of the filter array 130 to surround the two infrared (IR) filters 113-5. The green (G1 or G2) color filter 113-2 or 113-4 is in contact with the red (R) color filter 113-1 and the blue (B) color filter 113-3.

Figure 5D:
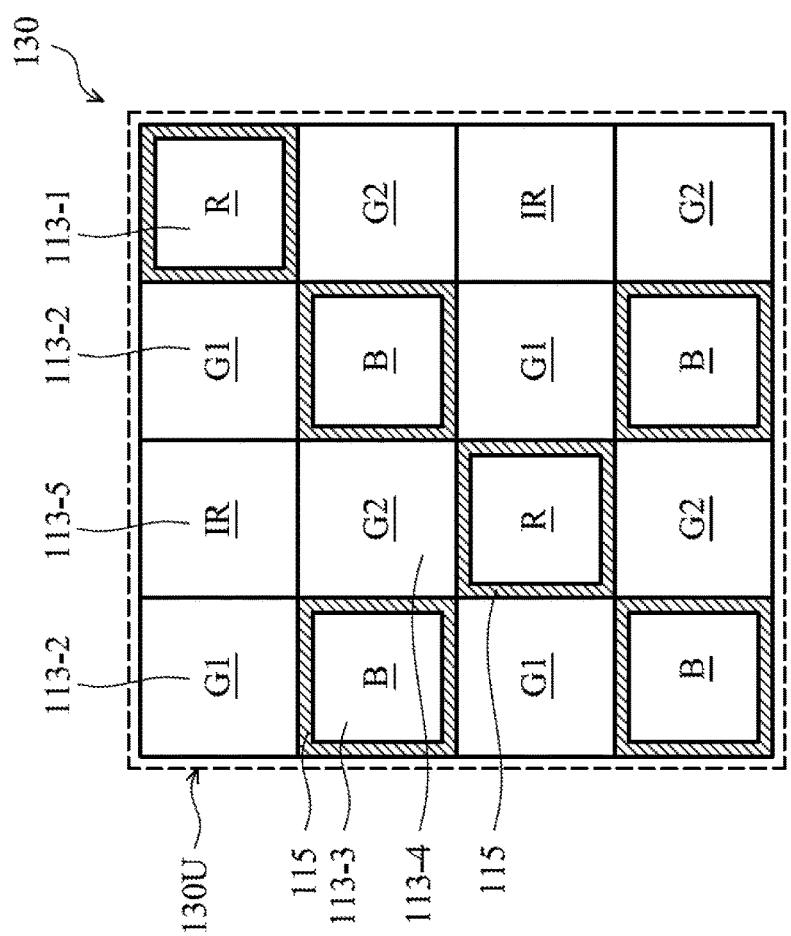

As shown in FIG. 5D, in some embodiments, two isolated partitions 115 are disposed in the repeat unit 130U of the filter array 130 to surround the two red (R) color filters 113-1. Moreover, four additional isolated partitions 115' are disposed in the repeat unit 130U of the filter array 130 to surround the four blue (B) color filters 113-3. The infrared (IR) filter 113-5 is in contact with the green (G1, G2) color filters 113-2 and 113-4.

Figure 5E:
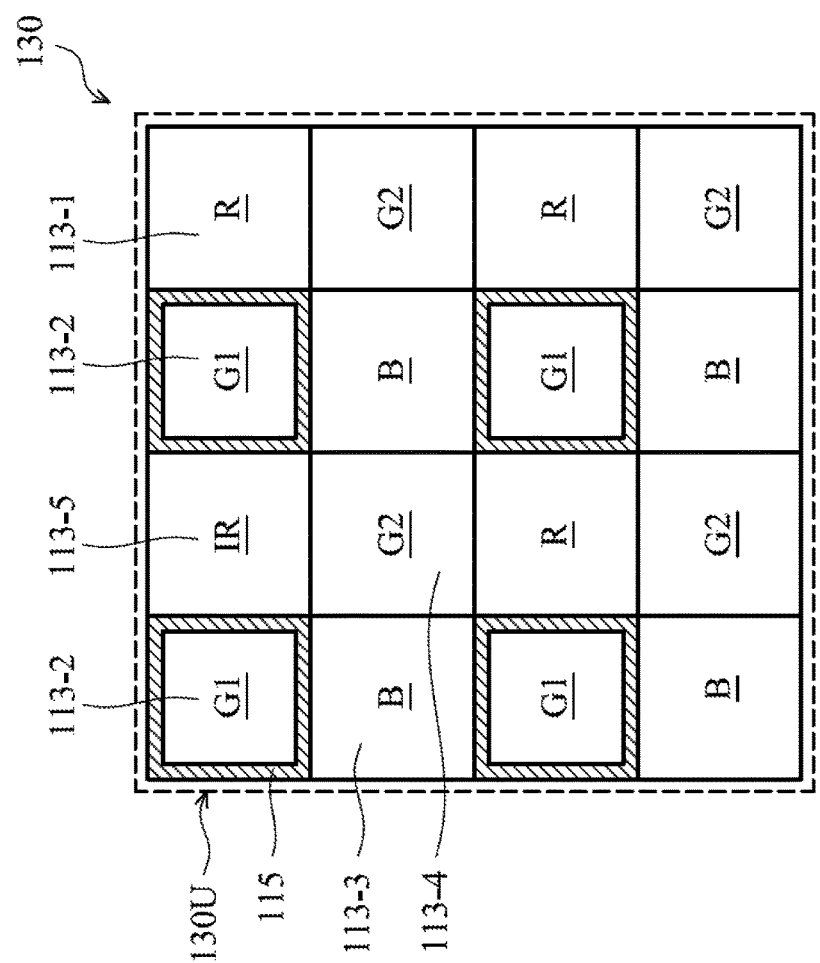

As shown in FIG. 5E, in some embodiments, four isolated partitions 115 are disposed in the repeat unit 130U of the filter array 130 to surround the four green (G1) color filters 113-2. In some other embodiments, four isolated partitions 115 are disposed in the repeat unit 130U of the filter array 130 to surround the four green (G2) color filters 113-4.

As shown in FIGS. 5A-5E, from a top view, the isolated partitions 115 or the isolated partitions 115 added with the additional isolated partitions 115' do not constitute a grid structure in the filter array 130.

Moreover, the isolated partitions 115 and the additional isolated partitions 115' of FIGS. 5A-5E are made of the same material and have the same refractive index that is lower than the refractive indexes of the red (R), green (G1, G2) and blue (B) color filters 113-1, 113-2, 113-4, 113-3 and is also lower than the refractive index of the infrared (IR) filter 113-5. Therefore, for an image sensor including the repeat unit 130U of the filter array 130 shown in FIG. 5A, the QE of R pixels of the image sensor is enhanced. For an image sensor including the repeat unit 130U of the filter array 130 shown in FIG. 5B, the QE of B pixels of the image sensor is enhanced. For an image sensor including the repeat unit 130U of the filter array 130 shown in FIG. 5C, the QE of IR pixels of the image sensor is enhanced. For an image sensor including the repeat unit 130U of the filter array 130 shown in FIG. 5D, both the QE of R pixels and the QE of B pixels of the image sensor are enhanced. For an image sensor including the repeat unit 130U of the filter array 130 shown in FIG. 5E, the QE of G1 pixels of the image sensor is enhanced.

Figure 6:
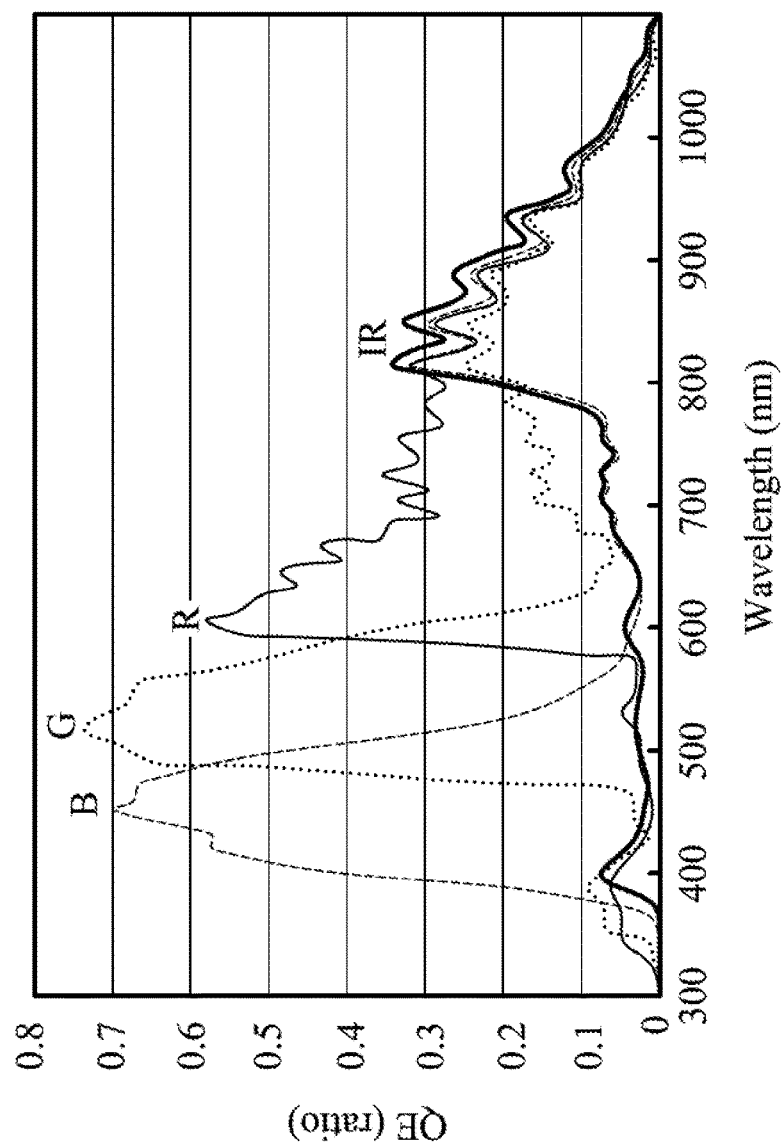
FIG. 6 shows a graph of QE vs. wavelength curves of R, G1, B, IR pixels of an image sensor without a partition disposed in a filter array.

FIG. 6 shows a graph of QE vs. wavelength curves R, G, B, IR of R, G, B, IR pixels of an image sensor without a partition disposed in a filter array. In some embodiments, image sensors including the repeat unit 130U of the filter array 130 shown in FIGS. 4A-4C and 4E and FIGS. 5A-5C and 5E can enhance the QE peaks of the curves R, G, B, IR shown in FIG. 6 individually. In some other embodiments, image sensors including the repeat unit 130U of the filter array 130 shown in FIG. 4D and FIG. 5D can enhance both the QE peaks of the curves R and B shown in FIG. 6.

Figure 7:
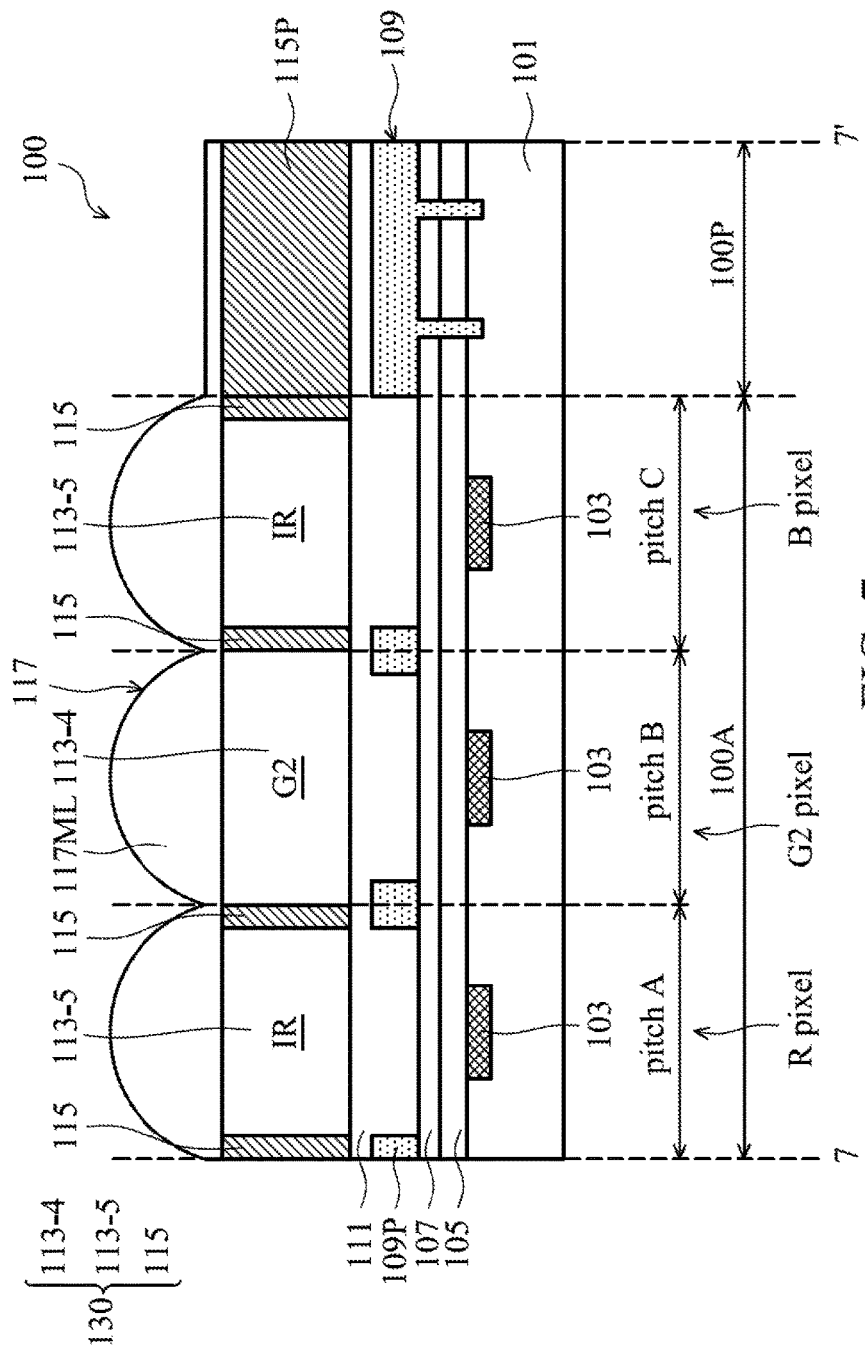
FIG. 7 shows a partial cross section of an image sensor along a line 7-7' of FIG. 4C according to some embodiments.

FIG. 7 shows a partial cross section of an image sensor 100 along a line 7-7' of FIG. 4C according to some embodiments. In some embodiments, the isolated partitions 115 are disposed in the filter array 130 to surround the IR filters 113-5. As shown in FIG. 4C and FIG. 7, each isolated partition 115 is completely disposed in one IR pixel. Thus, the area of one isolated partition 115 and one IR filter 113-5 added together is equal to the area of the other one color filter, such as the red (R) color filter 113-1, the green (G1 or G2) color filter 113-2 or 113-4, or the blue (B) color filter 113-3 that is not surrounded by the isolated partition 115. The elements of the image sensor 100 shown in FIG. 7 except the filter array 130 can be the same as those of FIG. 1B.

Figure 8:
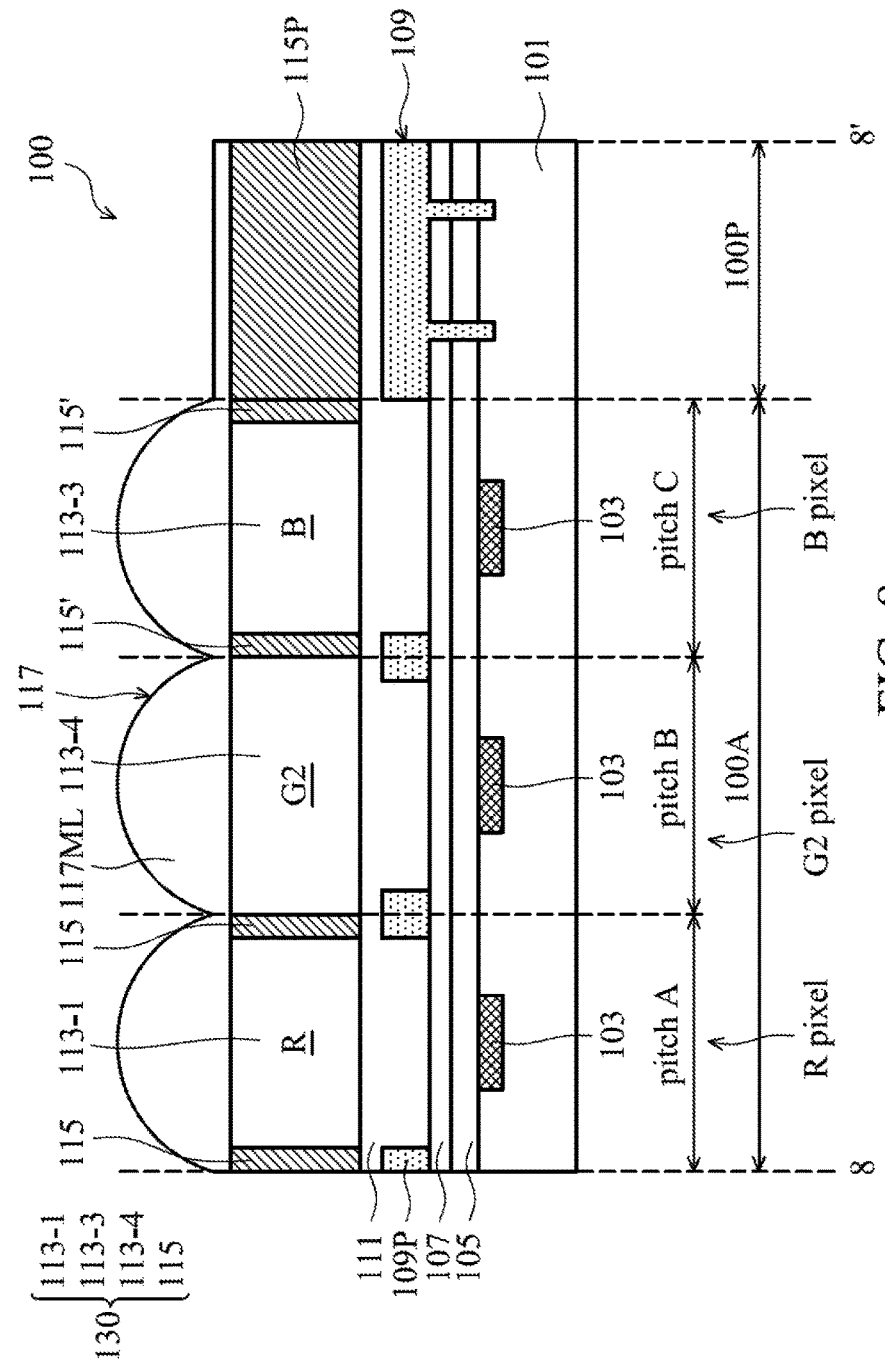
FIG. 8 shows a partial cross section of an image sensor along a line 8-8' of FIG. 4D according to some embodiments.

FIG. 8 shows a partial cross section of an image sensor 100 along a line 8-8' of FIG. 4D according to some embodiments. In some embodiments, the isolated partitions 115 are disposed in the filter array 130 to surround the red (R) color filters 113-1. Moreover, the additional isolated partitions 115' are disposed in the filter array 130 to surround the blue (B) color filters 113-3. Each isolated partition 115 is completely disposed in one R pixel. Also, each additional isolated partitions 115' is completely disposed in one B pixel Therefore, the area of one isolated partition 115 and one red (R) color filter 113-1 added together, the area of one additional isolated partitions 115' and one blue (B) color filter 113-3 added together, the area of the other one filter, such as the infrared (IR) filter 113-5, or the green (G1 or G2) color filter 113-2 or 113-4 that is not surrounded by the isolated partition 115 and the additional isolated partition 115' are equal. The elements of the image sensor 100 shown in FIG. 8 except the filter array 130 can be the same as those of FIG. 1B.

Figure 9:
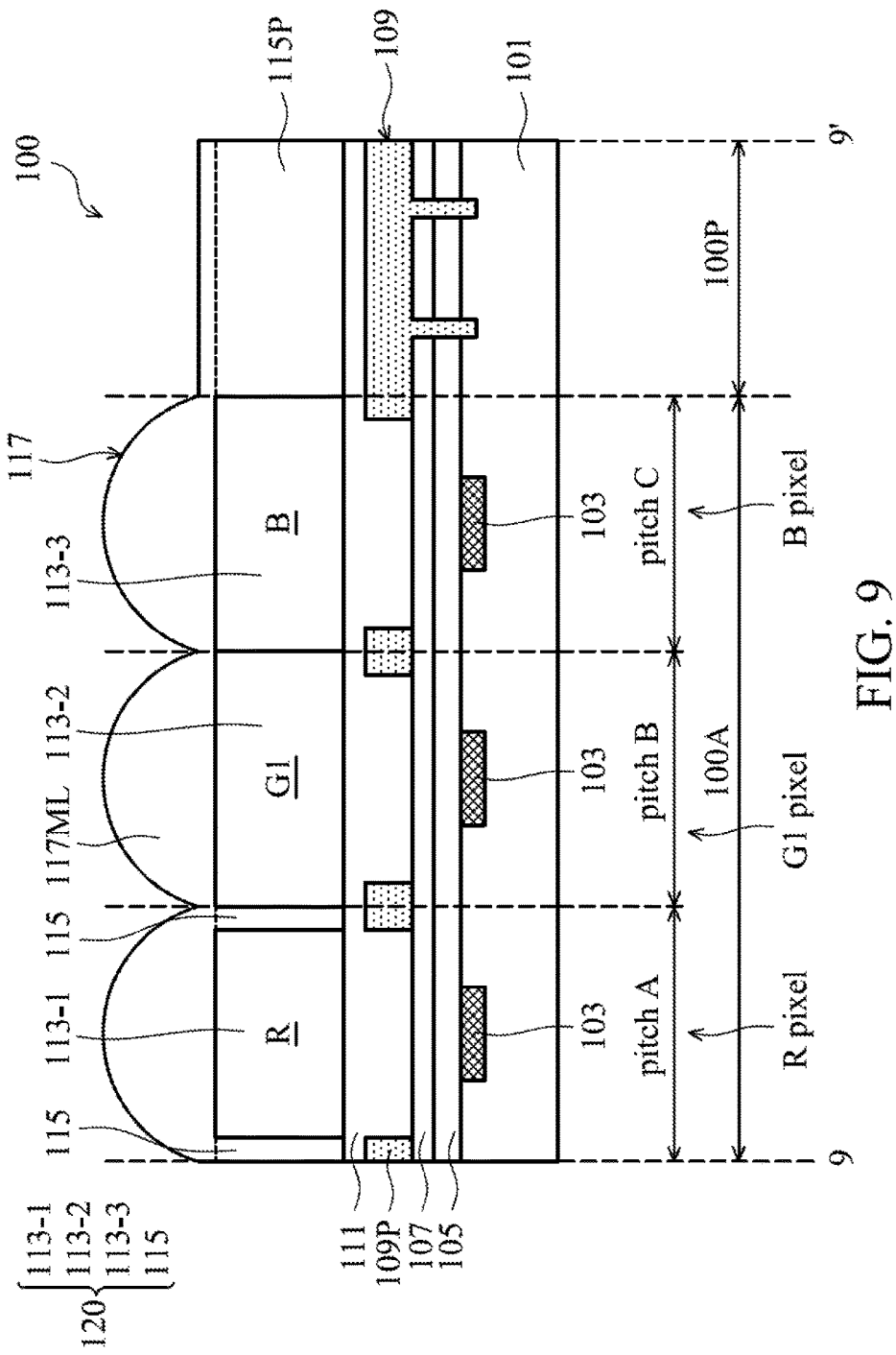
FIGS. 9-11 show partial cross sections of image sensors according to some other embodiments.

Referring to FIG. 9, a partial cross section of an image sensor 100 according to some other embodiments is shown. In some embodiments, the material of the isolated partition 115 is the same as the material of the microlens structure 117. In the embodiments, after forming the red (R) color filters 113-1, the green (G1, G2) color filters 113-2 and 113-4, and the blue (B) color filters 113-3 on the passivation layer 111, a gap is formed in the R pixel to surround the red (R) color filter 113-1. The material of the microlens structure 117 fills into the gap in the R pixel to form the isolated partition 115 that surrounds the red (R) color filter 113-1. Moreover, the material of the microlens structure 117 is also formed on the passivation layer 111 in the peripheral area 100P of the image sensor 100 to form an extended portion 115P. The elements of the image sensor 100 shown in FIG. 9 except the material of the isolated partition 115 and the extended portion 115P can be the same as those of FIG. 1B. In this embodiment, the isolated partition 115 has a refractive index that is higher than the refractive index of silicon oxide and lower than the refractive indexes of the red (R) color filters 113-1, the green (G1, G2) color filters 113-2 and 113-4, and the blue (B) color filters 113-3. For example, the refractive index of silicon oxide is about 1.3 to about 1.4, and the isolated partition 115 shown in FIG. 9 has a refractive index of higher than 1.4 to about 1.5.

Figure 10:
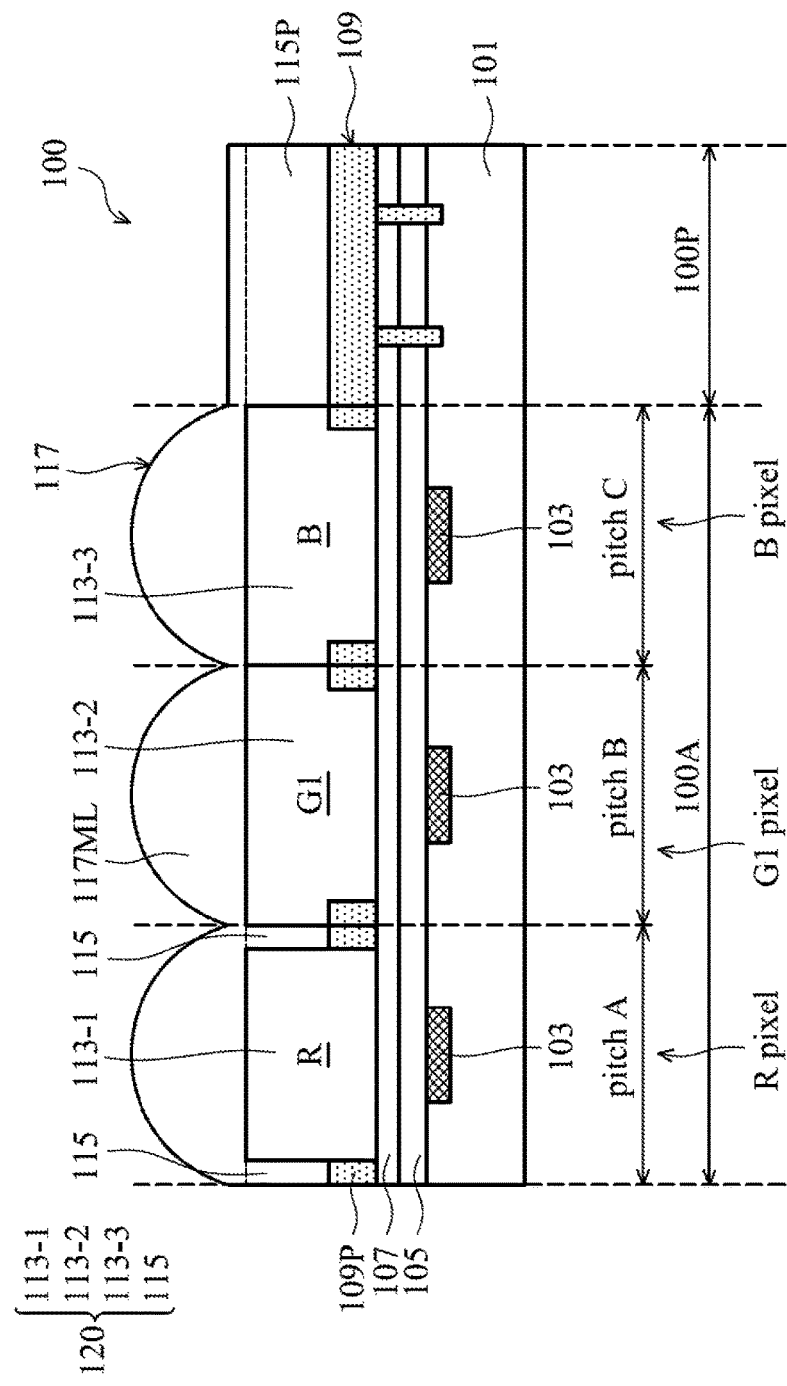

Referring to FIG. 10, a partial cross section of an image sensor 100 according to some other embodiments is shown. In some embodiments, the image sensor 100 has a light-shielding layer 109 formed on the buffer layer 107. The light-shielding layer 109 includes a plurality of light-shielding partitions 109P disposed between the pixels of the image sensor 100. From a top view, the light-shielding partitions 109P constitute a grid structure. Each of the red (R) color filters 113-1, the green (G1, G2) color filters 113-2 and 113-4, and the blue (B) color filters 113-3 individually fills into the spaces between the light-shielding partitions 109P and disposed on the buffer layer 107. In some embodiments, the light-shielding layer 109 has the shape of a grid and is disposed between the red (R) color filters 113-1, the green (G1, G2) color filters 113-2 and 113-4, and the blue (B) color filters 113-3 shown in FIGS. 1A, 2A and 3A. Thus, the light-shielding layer 109 and the color filter array 120 are disposed on the top surface of the buffer layer 107. In some other embodiments, the light-shielding layer 109 has the shape of a grid and is disposed between the red (R) color filters 113-1, the green (G1, G2) color filters 113-2 and 113-4, the blue (B) color filters 113-3 and the infrared (IR) filters 113-5 shown in FIGS. 4A-4E and FIG. 5A-5E. Thus, the light-shielding layer 109 and the filter array 130 are disposed on the top surface of the buffer layer 107.

As shown in FIG. 10, the top of the light-shielding layer 109 is lower than the top of the color filter array 120. In some embodiments, the isolated partition 115 is made of the same material as the microlens structure 117 and is disposed on the light-shielding layer 109 to surround the red (R) color filter 113-1. Moreover, the material of the microlens structure 117 is also formed on the light-shielding layer 109 in the peripheral area 100P of the image sensor 100 to be an extended portion 115P.

Figure 11:
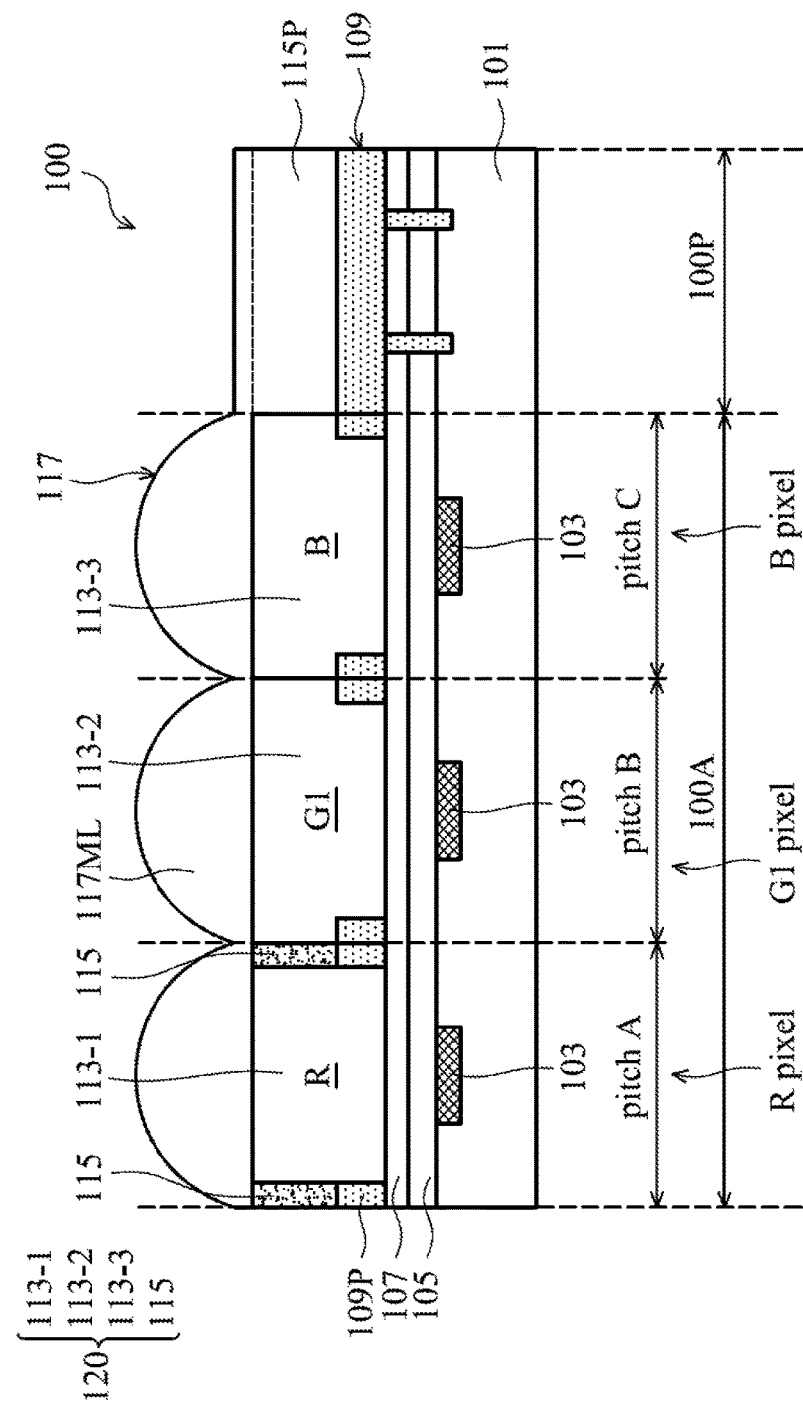

Referring to FIG. 11, a partial cross section of an image sensor 100 according to some other embodiments is shown. In some embodiments, the isolated partition 115 is made of a low refractive index (n) material having a refractive index that is lower than the refractive index of silicon oxide. For example, the refractive index of silicon oxide is about 1.3 to about 1.4, and the isolated partition 115 has a refractive index of about 1.2 to lower than 1.3. The low refractive index (n) material fills into the space on the light-shielding layer 109 to surround the red (R) color filter 113-1 and the isolated partition 115 is formed. Moreover, the material of the microlens structure 117 is formed on the light-shielding layer 109 in the peripheral area 100P of the image sensor 100 to be the extended portion 115P. The elements of the image sensor 100 shown in FIG. 11 except the material of the isolated partition 115 can be the same as those of FIG. 10.

In some other embodiments, the color filter array 120 shown in FIGS. 9-11 can be replaced with the filter array 130 shown in FIGS. 4A-4E and FIGS. 5A-5E. The isolated partition 115 and the addition isolated partition 115' can be made of the same material as the microlens structure 117, or a low refractive index (n) material which has a refractive index that is lower than the refractive index of silicon oxide. Moreover, the material of forming the isolated partition 115 and the addition isolated partition 115' can fill the space on the light-shielding layer 109 to surround one kind or two kinds of the red (R) color filters 113-1, the green (G1, G2) color filters 113-2 and 113-4, the blue (B) color filters 113-3 and the infrared (IR) filters 113-5.

According to some embodiments of the disclosure, the isolated partitions is disposed in the color filter array or the filter array to surround one kind of the filter elements of the color filter array or the filter array. In some embodiments, the color filter array includes a first, second and third color filters, such as a red, green, and blue color filters, which can be arranged in various patterns. Therefore, the isolated partitions disposed in the color filter array to surround the red, or green, or blue color filter. In some embodiments, the filter array includes a first, second and third color filters and an infrared filter, such as a red, green, and blue color filters and an IR filter, which can be arranged in various patterns. Therefore, the isolated partition disposed in the filter array to surround the red, or green, or blue color filter, or the IR filter.

In the embodiments of the disclosure, from a top view, the isolated partitions in the color filter array or the filter array do not constitute a grid structure. Thus, the shape of the isolated partitions in the color filter array or the filter array is not a grid. In addition, the image sensor has a number of pixels arranged in a pixel array. Each of the isolated partitions is individually disposed in one pixel of the image sensor and is not extended to the adjacent pixels. Moreover, each pixel of the image sensor has the same size in area. Therefore, the area of one isolated partition and one filter element surrounded by the isolated partition added together is equal to the area of the other one filter element that is not surrounded by the isolated partition.

In the embodiments of the disclosure, the isolated partition has a refractive index that is lower than the refractive indexes of the filter elements of the color filter array and the filter array. Thus, the QE of the pixels in the image sensor corresponding to the one kind of the filter elements surrounded by the isolated partition is enhanced. Therefore, according to the embodiments of the disclosure, the isolated partition in the color filter array or the filter array can adjust the QE and enhance the QE of a certain kind of the pixels in the image sensor for a high dynamic range application and customized applications. Furthermore, the image sensors of the disclosure can be used in BSI or FSI image sensors.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a semiconductor substrate containing a plurality of photoelectric conversion elements;
   a filter array, including a first color filter, a second color filter, a third color filter and an infrared filter, disposed above the semiconductor substrate;
   an isolated partition disposed in the filter array to surround one of the first, second and third color filters and the infrared filter, wherein the isolated partition has a refractive index that is lower than the refractive indexes of the first, second and third color filters and the refractive index of the infrared filter, wherein an area of the isolated partition and the one of the first filter, the second filter, the third filter and the infrared filter surrounded by the isolated partition added together is equal to the area of the other one of the first filter, the second filter, the third filter and the infrared filter that is not surrounded by the isolated partition; and
   an additional isolated partition disposed in the filter array, wherein the filter array includes a red color filter, a green color filter, a blue color filter and the infrared filter, the isolated partition and the additional isolated partition surround the red and the blue color filters, respectively, and the infrared filter is in contact with the green color filter.

2. The image sensor as claimed in claim 1, wherein a material of the isolated partition and the additional isolated partition include silicon oxide or a material with a refractive index that is lower than the refractive index of silicon oxide.

3. The image sensor as claimed in claim 1, further comprising a microlens structure disposed above the filter array, wherein a material of the isolated partition and the additional isolated partition are the same as the material of the microlens structure.

4. The image sensor as claimed in claim 1, wherein an area of the isolated partition and one red color filter surrounded by the isolated partition added together, an area of the additional isolated partition and one blue color filter surrounded by the additional isolated partition added together, an area of one green color filter, and an area of one infrared filter are equal.

5. The image sensor as claimed in claim 1, further comprising:
   a microlens structure disposed above the filter array;
   a light-shielding layer disposed underneath the filter array;
   a high dielectric-constant film disposed on the semiconductor substrate;
   a buffer layer disposed on the high dielectric-constant film; and
   a passivation layer disposed on the buffer layer and covering the light-shielding layer.

6. The image sensor as claimed in claim 1, further comprising:
   a microlens structure disposed above the filter array;
   a high dielectric-constant film disposed on the semiconductor substrate;
   a buffer layer disposed on the high dielectric-constant film; and
   a light-shielding layer and the filter array disposed on the top surface of the buffer layer, wherein the light-shielding layer has the shape of a grid and is disposed between the first, second and third color filters and the infrared filter, the top of the light-shielding layer is lower than the top of the filter array, and the isolated partition is disposed on the light-shielding layer.

7. The image sensor as claimed in claim 1, wherein the filter array is arranged with eight green color filters, four infrared filters, two red color filters and two blue color filters in a repeat unit of the filter array, or is arranged with eight green color filters, four blue color filters, two red color filters and two infrared filters in a repeat unit of the filter array.

* * * * *